(12) United States Patent
Sakakura et al.

(10) Patent No.: US 8,378,344 B2
(45) Date of Patent: Feb. 19, 2013

(54) LIGHT-EMITTING DEVICE WITH PLURAL KINDS OF THIN FILM TRANSISTORS AND CIRCUITS OVER ONE SUBSTRATE

(75) Inventors: Masayuki Sakakura, Tochigi (JP);
Yoshiaki Oikawa, Kanagawa (JP);
Shunpei Yamazaki, Tokyo (JP);
Junichiro Sakata, Kanagawa (JP);
Masashi Tsubuku, Kanagawa (JP);
Kengo Akimoto, Kanagawa (JP);
Miyuki Hosoba, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 147 days.

(21) Appl. No.: 12/869,327

(22) Filed: Aug. 26, 2010

(65) Prior Publication Data

US 2011/0210324 A1    Sep. 1, 2011

(30) Foreign Application Priority Data

Sep. 4, 2009   (JP) .................................. 2009-204929

(51) Int. Cl.
*H01L 29/10* (2006.01)
(52) U.S. Cl. ....... 257/43; 257/72; 257/61; 257/E33.004; 349/43; 438/46
(58) Field of Classification Search .................... 257/43, 257/61, 72, E33.004; 349/43; 438/46
See application file for complete search history.

(56) References Cited

U.S. PATENT DOCUMENTS

| | | | |
|---|---|---|---|
| 5,499,124 A | 3/1996 | Vu et al. | |
| 5,534,722 A | 7/1996 | Takasu et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,476,784 B2 | 11/2002 | Zavracky et al. | |
| 6,533,965 B1 | 3/2003 | Sasaki et al. | |

(Continued)

FOREIGN PATENT DOCUMENTS

| EP | 1737044 A | 12/2006 |
|---|---|---|
| EP | 1770788 A | 4/2007 |

(Continued)

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

(Continued)

*Primary Examiner* — Marcos D. Pizarro
*Assistant Examiner* — Eva Yan Montalvo
(74) *Attorney, Agent, or Firm* — Eric J. Robinson; Robinson Intellectual Property Law Office, P.C.

(57) ABSTRACT

It is an object to provide a light-emitting device in which plural kinds of circuits are formed over one substrate and plural kinds of thin film transistors corresponding to characteristics of the plural kinds of circuits are provided. An inverted coplanar thin film transistor in which an oxide semiconductor layer overlaps with a source electrode layer and a drain electrode layer is used for a pixel, and a channel-etched thin film transistor is used for a driver circuit. A color filter layer is provided between the pixel thin film transistor and a light-emitting element which is electrically connected to the pixel thin film transistor so as to overlap with the light-emitting element.

20 Claims, 15 Drawing Sheets

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,646,015 B2 | 1/2010 | Fujii et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 7,749,825 B2 | 7/2010 | Honda |
| 7,915,689 B2 | 3/2011 | Cho et al. |
| 7,943,985 B2 | 5/2011 | Kim et al. |
| 8,017,947 B2 | 9/2011 | Kim et al. |
| 8,022,411 B2 | 9/2011 | Yoon et al. |
| 8,115,883 B2 | 2/2012 | Yamazaki et al. |
| 2001/0025958 A1* | 10/2001 | Yamazaki et al. ............... 257/72 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0111663 A1 | 6/2003 | Yagi |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0023750 A1* | 2/2007 | Chiang et al. .................. 257/43 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0087487 A1 | 4/2007 | Honda |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0073674 A1 | 3/2008 | Cho et al. |
| 2008/0083950 A1 | 4/2008 | Pan et al. |
| 2008/0099759 A1 | 5/2008 | Fujii et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0193794 A1 | 8/2008 | Egawa et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0050876 A1 | 2/2009 | Marks et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0160741 A1 | 6/2009 | Inoue et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0003783 A1 | 1/2010 | Akimoto |
| 2010/0038639 A1 | 2/2010 | Akimoto |
| 2010/0044701 A1 | 2/2010 | Sano et al. |
| 2010/0051938 A1 | 3/2010 | Hayashi et al. |
| 2010/0059754 A1 | 3/2010 | Lee et al. |
| 2010/0065844 A1 | 3/2010 | Tokunaga |
| 2010/0084648 A1 | 4/2010 | Watanabe |
| 2010/0090211 A1 | 4/2010 | Fujii et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0163863 A1 | 7/2010 | Yaegashi |
| 2010/0163874 A1 | 7/2010 | Koyama et al. |
| 2010/0163876 A1 | 7/2010 | Inoue et al. |
| 2010/0264420 A1 | 10/2010 | Honda |
| 2010/0283049 A1 | 11/2010 | Sato et al. |
| 2011/0012112 A1 | 1/2011 | Yamazaki et al. |
| 2011/0012116 A1 | 1/2011 | Yamazaki et al. |
| 2011/0031492 A1 | 2/2011 | Yamazaki et al. |
| 2011/0031493 A1 | 2/2011 | Yamazaki et al. |
| 2011/0031496 A1 | 2/2011 | Yamazaki et al. |
| 2011/0031497 A1 | 2/2011 | Yamazaki et al. |
| 2011/0032444 A1 | 2/2011 | Yamazaki et al. |
| 2011/0049510 A1 | 3/2011 | Yamazaki et al. |
| 2011/0057186 A1 | 3/2011 | Yamazaki et al. |
| 2011/0057187 A1 | 3/2011 | Sakakura et al. |
| 2011/0058116 A1 | 3/2011 | Yamazaki et al. |

| | | | |
|---|---|---|---|
| 2011/0210325 | A1 | 9/2011 | Sakakura et al. |
| 2011/0210355 | A1 | 9/2011 | Yamazaki et al. |
| 2012/0126232 | A1 | 5/2012 | Yamazaki et al. |

FOREIGN PATENT DOCUMENTS

| | | |
|---|---|---|
| EP | 1983499 A | 10/2008 |
| EP | 1995787 A | 11/2008 |
| EP | 2 006 824 | 12/2008 |
| EP | 1998373 A | 12/2008 |
| EP | 1998374 A | 12/2008 |
| EP | 1998375 A | 12/2008 |
| EP | 2 202 802 | 6/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2006-313363 A | 11/2006 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-165861 A | 6/2007 |
| JP | 2007-171932 | 7/2007 |
| JP | 2007-212699 A | 8/2007 |
| JP | 2008-135731 A | 6/2008 |
| JP | 2008-535205 | 8/2008 |
| JP | 2009-265271 | 11/2009 |
| JP | 2010-098280 | 4/2010 |
| WO | WO 2004/114391 | 12/2004 |
| WO | WO 2007/043493 | 4/2007 |
| WO | WO-2007/058329 | 5/2007 |
| WO | WO-2007/089048 | 8/2007 |
| WO | 2007/119386 | 10/2007 |
| WO | WO 2007/119727 | 10/2007 |
| WO | WO 2008/069056 | 6/2008 |
| WO | WO 2008/069255 | 6/2008 |
| WO | WO 2008/105347 | 9/2008 |
| WO | WO-2008/126879 | 10/2008 |
| WO | WO-2009/072532 | 6/2009 |

OTHER PUBLICATIONS

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-Zno System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTS," IDW '09: Proceedings of the 16th International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-277.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases,", Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, Or Al; B: Mg, Mn, Fe, Ni, Cu, or Zn] at Temperatures Over 1000° C" Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

International Search Report (Application No. PCT/JP2010/064425) dated Sep. 21, 2010.

Written Opinion (Application No. PCT/JP2010/064425) dated Sep. 21, 2010.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SIG Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura. M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio.Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschtift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Tetsuo Nozawa, "Transparent Circuit,", Nikkei Electronics, Aug. 27, 2007, No. 959, pp. 39-52.

* cited by examiner

FIG. 5A1
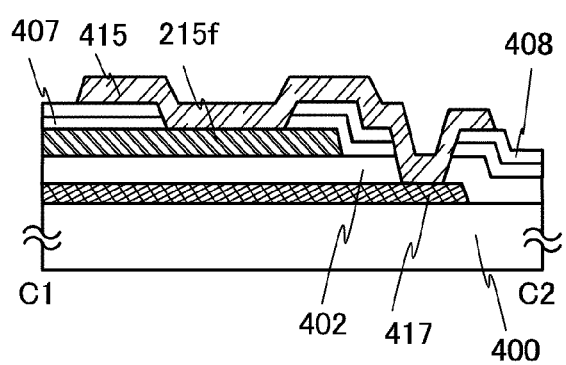
FIG. 5A2
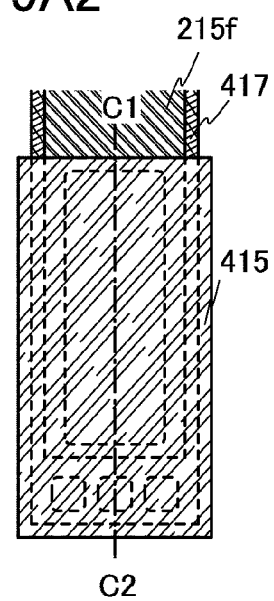
FIG. 5B1
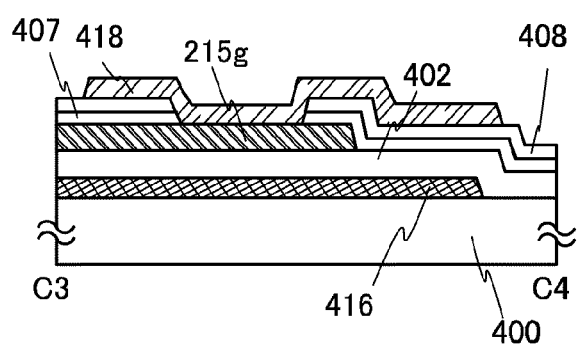
FIG. 5B2
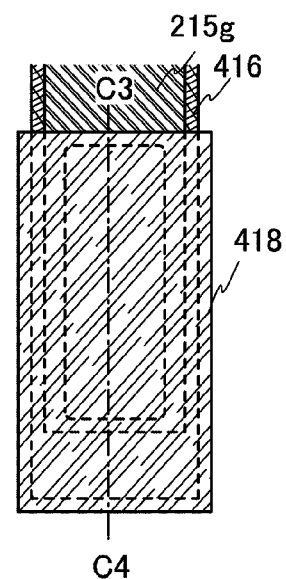

LIGHT-EMITTING DEVICE WITH PLURAL KINDS OF THIN FILM TRANSISTORS AND CIRCUITS OVER ONE SUBSTRATE

TECHNICAL FIELD

The present invention relates to a light-emitting device in which a layer including an organic compound serves as a light-emitting layer and a method for manufacturing the light-emitting device. The present invention relates to an electronic appliance in which a light-emitting display device including an organic light-emitting element is mounted as a component, for example.

BACKGROUND ART

Light-emitting elements using an organic compound as a light emitter, which have features such as thinness, light-weight, high-speed response, and direct current low voltage driving, have been considered to be applied to next-generation flat panel displays or next-generation lights. In particular, a display device in which light-emitting elements are arranged in matrix is considered to have an advantage in a wide viewing angle and excellent visibility over a conventional liquid crystal display device.

It is said that light-emitting elements have a mechanism of light emission as follows: by applying voltage between a pair of electrodes with an electroluminescent (EL) layer interposed therebetween, electrons injected from a cathode and holes injected from an anode recombine with each other in an emission center of the EL layer to form molecular excitons, and energy is released when the molecular excitons relax to the ground state; accordingly light is emitted. Singlet excitation and triplet excitation are known as excited states, and it is thought that light emission can be obtained through either of the excited states.

An EL layer included in a light-emitting element includes at least a light-emitting layer. In addition, the EL layer can have a stacked structure including a hole-injection layer, a hole-transport layer, an electron-transport layer, an electron-injection layer, and/or the like, in addition to the light-emitting layer.

In addition, metal oxides attract attention as materials having semiconductor characteristics. Examples of such metal oxides having semiconductor characteristics are tungsten oxide, tin oxide, indium oxide, zinc oxide, and the like. A thin film transistor (also referred to as a TFT) in which a channel formation region is formed using such metal oxides having semiconductor characteristics is known (Patent Documents 1 and 2).

Further, TFTs including oxide semiconductors have high field-effect mobility. Therefore, driver circuits in display devices or the like can be formed using the TFTs.

REFERENCE

Patent Document

[Patent Document 1] Japanese Published Patent Application No. 2007-123861
[Patent Document 2] Japanese Published Patent Application No. 2007-96055

DISCLOSURE OF INVENTION

When a plurality of circuits which are different from each other is formed over an insulating surface, for example, when a pixel portion and a driver circuit are formed over one substrate, excellent switching characteristics such as a high on-off ratio are needed for a thin film transistor used for the pixel portion, and high operation speed is needed for a thin film transistor used for the driver circuit. In particular, as a display device has higher definition, writing time of a display image is reduced. Therefore, it is preferable that the thin film transistor used for the driver circuit operate at high speed.

An object of an embodiment of the present invention is to provide a light-emitting device in which plural kinds of circuits are formed over one substrate and plural kinds of thin film transistors corresponding to characteristics of the plural kinds of circuits are provided.

Another object of an embodiment of the present invention is to manufacture a highly reliable light-emitting device with the use of a highly reliable thin film transistor having favorable electric characteristics as a switching element.

An embodiment of the present invention is a light-emitting device including a display portion (also referred to as a pixel portion) and a driver circuit over one substrate. A pixel thin film transistor has a structure different from that of a driver circuit thin film transistor. A first thin film transistor included in the pixel portion is an inverted coplanar (also referred to as bottom-contact) thin film transistor which includes an oxide semiconductor layer overlapping with a source electrode layer and a drain electrode layer. A second thin film transistor included in the driver circuit is a channel-etched thin film transistor in which end portions of a source electrode layer and a drain electrode layer overlap with an oxide semiconductor layer.

Further, a top surface portion and a side surface portion of the oxide semiconductor layer of the first thin film transistor and a part of a top surface portion of the oxide semiconductor layer of the second thin film transistor are in contact with an oxide insulating film. Note that the source electrode layer and the drain electrode layer of the first thin film transistor are formed using an oxide conductive film, the source electrode layer and the drain electrode layer of the second thin film transistor are formed using a metal conductive film, and a driver circuit wiring is formed using a metal conductive film.

The driver circuit thin film transistor is a bottom-gate thin film transistor in which the oxide insulating film is provided so as to be in contact with the oxide semiconductor layer exposed between the source electrode layer and the drain electrode layer.

The driver circuit thin film transistor includes the drain electrode layer formed using a metal conductive film of Ti or the like. The drain electrode layer is in contact with a part of the top surface of the oxide semiconductor layer, and a high-resistance drain region (also referred to as an HRD region) which is an oxygen-deficient region and overlaps with the drain electrode layer is formed. Specifically, the carrier concentration of the high-resistance drain region is higher than or equal to $1\times10^{18}/cm^3$ and is at least higher than the carrier concentration of a channel formation region (lower than $1\times10^{18}/cm^3$). Note that the carrier concentration in this specification is a carrier concentration obtained by Hall effect measurement at room temperature.

Further, the source electrode layer is in contact with a part of the top surface of the oxide semiconductor layer, and a high-resistance source region (also referred to as an HRS region) which is an oxygen-deficient region and overlaps with the source electrode layer is formed.

When a plurality of first pixel electrodes which are electrically connected to the corresponding first thin film transistors is formed in the pixel portion and a light-emitting element is formed over each of the first pixel electrodes, a light-emitting device such as a display device can be manufactured. Moreover, when light-emitting elements of plural emission colors are provided in the pixel portion, a light-emitting device capable of full-color display can be manufactured. Alternatively, when a plurality of light-emitting elements which emits white light is provided and optical films, specifically color filters, are provided so as to overlap with light-emitting regions of the respective light-emitting elements, a full-color light-emitting display device can be manufactured.

In the case where a color filter is provided between the light-emitting element which emits white light and the pixel thin film transistor so that display is performed by light emission passing through the color filter from the light-emitting element, a conductive film having a light-transmitting property may be used as materials of a gate electrode layer, the source electrode layer, and the drain electrode layer of the pixel thin film transistor, whereby the aperture ratio can be improved. In this specification, the color filter refers not to a whole of a film including color filter layers of three colors (such as a red color filter, a blue color filter, and a green color filter) in addition to a black matrix and/or an overcoat but to a color filter of one color.

In short, an embodiment of the present invention is a light-emitting device including a display portion (also referred to as a pixel portion) which includes a first thin film transistor and a driver circuit which includes a second thin film transistor having a structure different from that of the first thin film transistor over one substrate. The first thin film transistor includes a gate electrode layer over the substrate; a gate insulating layer over the gate electrode layer; a first electrode layer and a second electrode layer over the gate insulating layer; an oxide semiconductor layer over the gate insulating layer, which overlaps with the first electrode layer and the second electrode layer; an oxide insulating layer which is in contact with the oxide semiconductor layer; and a connection electrode layer over the gate insulating layer, which is electrically connected to the second electrode layer. In addition, the gate electrode layer, the gate insulating layer, the oxide semiconductor layer, the first electrode layer, the second electrode layer, and the oxide insulating layer of the first thin film transistor have a light-transmitting property. The pixel portion includes a color filter layer over the oxide insulating layer; a first pixel electrode over the color filter layer, which is electrically connected to the connection electrode layer; a light-emitting layer over the first pixel electrode; and a second electrode over the light-emitting layer.

Another embodiment of the present invention is a light-emitting device having the above structure, in which a gate electrode layer, a source electrode layer, and a drain electrode layer of the second thin film transistor are formed using a material different from that of the gate electrode layer, the first electrode layer, and the second electrode layer of the first thin film transistor, and in which the gate electrode layer, the source electrode layer, and the drain electrode layer of the second thin film transistor are formed using a conductive material having lower resistance than that of the first electrode layer and the second electrode layer of the first thin film transistor.

Still another embodiment of the present invention is a light-emitting device having the above structure, in which the connection electrode layer is formed using a film containing an element selected from Al, Cr, Cu, Ta, Ti, Mo, and W as a main component, an alloy film containing any of the elements, or a stacked film including the films in combination.

Still another embodiment of the present invention is a light-emitting device having the above structure, in which the source electrode layer and the drain electrode layer of the second thin film transistor are formed using the same material as the connection electrode layer of the first thin film transistor.

Still another embodiment of the present invention is a light-emitting device having the above structure, in which the first electrode layer and the second electrode layer of the first thin film transistor are formed using indium oxide, indium oxide-tin oxide alloy, indium oxide-zinc oxide alloy, or zinc oxide.

Still another embodiment of the present invention is a light-emitting device having the above structure, in which the first thin film transistor and the second thin film transistor each include an oxide semiconductor layer and the oxide insulating layer over the oxide semiconductor layer, and in which a channel formation region of the oxide semiconductor layer is in contact with the oxide insulating layer.

Still another embodiment of the present invention is a light-emitting device having the above structure, in which the oxide insulating layer which is in contact with the channel formation regions of the oxide semiconductor layers of the first thin film transistor and the second thin film transistor is formed using an inorganic insulating film formed by a sputtering method, typically a silicon oxide film, a silicon nitride oxide film, an aluminum oxide film, an aluminum oxynitride film, or the like.

With the above structure, at least one of the above problems can be solved.

As the oxide semiconductor layer, a thin film expressed by 1 $nMO_3(ZnO)_m$ (m>0) is formed, and a thin film transistor using the thin film as an oxide semiconductor layer is manufactured. Note that M denotes one metal element or a plurality of metal elements selected from Ga, Fe, Ni, Mn, and Co. As an example, M may be Ga or may contain the above metal element in addition to Ga; for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, an oxide semiconductor layer whose composition formula is expressed by $InMO_3 (ZnO)_m$ (m>0) where Ga is contained as M is referred to as an In—Ga—Zn—O-based oxide semiconductor, and a thin film thereof is also referred to as an In—Ga—Zn—O-based non-single-crystal film.

As a metal oxide applied to the oxide semiconductor layer, any of the following metal oxides can be applied besides the above: an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon oxide may be contained in an oxide semiconductor layer formed using the above metal oxide.

Another embodiment of the present invention, which realizes the above structure, is a method for manufacturing a light-emitting device, including the steps of: forming a first gate electrode layer and a second gate electrode layer over a substrate having an insulating surface; forming a gate insulating layer over the first gate electrode layer and the second gate electrode layer; forming, over the gate insulating layer, a first electrode layer and a second electrode layer which overlap with the first gate electrode layer; forming, over the gate insulating layer, a first oxide semiconductor layer which overlaps with the first gate electrode layer, a part of the first electrode layer, and a part of the second electrode layer and a second oxide semiconductor layer which overlaps with the second gate electrode layer; forming a source electrode layer and a drain electrode layer over the second oxide semiconductor layer, and a connection electrode layer which is electrically connected to the second electrode layer, over the gate insulating layer; forming an oxide insulating layer which is in contact with a top surface portion and a side surface portion of the first oxide semiconductor layer and a top surface portion of the second oxide semiconductor layer; forming a color filter layer over the oxide insulating layer which overlaps with the first oxide semiconductor layer; forming, over the color filter layer, a first pixel electrode which is electrically connected to the connection electrode layer; forming a light-emitting layer over the first pixel electrode; and forming a second electrode over the light-emitting layer.

In the above manufacturing method, the oxide insulating layer which is in contact with the first oxide semiconductor layer and the second oxide semiconductor layer is formed without exposure to air after dehydration or dehydrogenation of the oxide semiconductor layers; thus water or hydrogen is prevented from entering the oxide semiconductor layers.

Dehydration or dehydrogenation is heat treatment performed in an inert gas atmosphere of nitrogen or a rare gas (such as argon or helium) at a temperature higher than or equal to 400° C. and lower than 750° C., preferably higher than or equal to 425° C. and lower than or equal to 700° C.; thus, impurities such as moisture included in the oxide semiconductor layers are reduced.

In the case where heat treatment is performed in an inert gas atmosphere of nitrogen or a rare gas (such as argon or helium), an oxide semiconductor layer is changed into an oxygen-deficient oxide semiconductor layer by the heat treatment to be a low-resistance oxide semiconductor layer, i.e., an n-type (such as n$^-$-type) oxide semiconductor layer. Then, the oxide semiconductor layer is made to be in an oxygen-excess state by the formation of an oxide insulating film which is in contact with the oxide semiconductor layer. Accordingly, the oxide semiconductor layer is changed into a high-resistance oxide semiconductor layer, i.e., an i-type oxide semiconductor layer. Accordingly, it is possible to manufacture and provide a semiconductor device including a highly reliable thin film transistor having favorable electric characteristics.

The oxide semiconductor layers are subjected to dehydration or dehydrogenation under a heat treatment condition that two peaks of water or at least one peak of water at around 300° C. is not detected even if thermal desorption spectroscopy (TDS) is performed at up to 450° C. on the oxide semiconductor layers subjected to dehydration or dehydrogenation. Therefore, even if TDS is performed at up to 450° C. on a thin film transistor including an oxide semiconductor layer subjected to dehydration or dehydrogenation, at least the peak of water at around 300° C. is not detected.

In addition, when the temperature is lowered from a heating temperature T at which dehydration or dehydrogenation is performed, it is important to prevent the dehydrated or dehydrogenated oxide semiconductor layers from being exposed to air by continuously using a furnace in which dehydration or dehydrogenation is performed, so that water or hydrogen is prevented from entering the oxide semiconductor layers. When a thin film transistor is manufactured using an oxide semiconductor layer obtained by changing an oxide semiconductor layer into a low-resistance oxide semiconductor layer, i.e., an n-type (such as n$^-$-type or n$^+$-type) oxide semiconductor layer by dehydration or dehydrogenation and by changing the low-resistance oxide semiconductor layer into a high-resistance oxide semiconductor layer to be an i-type oxide semiconductor layer, the threshold voltage of the thin film transistor can be positive, so that a so-called normally-off switching element can be realized. It is desirable for a display device that a channel be formed with positive threshold voltage which is as close to 0 V as possible in a thin film transistor. If the threshold voltage of the thin film transistor is negative, it tends to be normally on; in other words, current flows between the source electrode and the drain electrode even when the gate voltage is 0 V. In an active matrix display device, electric characteristics of thin film transistors included in a circuit are important and performance of the display device depends on the electric characteristics. Among the electric characteristics of a thin film transistor, in particular, threshold voltage ($V_{th}$) is important. When the threshold voltage value is high or is on the minus side even when the field effect mobility is high, it is difficult to control the circuit. In the case where a thin film transistor has a high threshold voltage value and a large absolute value of its threshold voltage, the thin film transistor cannot perform switching function and may be a load when the transistor is driven at low voltage. In the case of an n-channel thin film transistor, it is desirable that a channel be formed and drain current begin to flow after positive voltage is applied as gate voltage. A transistor in which a channel is not formed unless the driving voltage is increased and a transistor in which a channel is formed and drain current flows even in a negative voltage state are unsuitable for a thin film transistor used in a circuit.

In addition, a gas atmosphere in which the temperature is lowered from the heating temperature T may be different from a gas atmosphere in which the temperature is raised to the heating temperature T. For example, cooling is performed without exposure to air by using the furnace in which dehydration or dehydrogenation is performed and by filling the furnace with a high-purity oxygen gas, a high-purity N$_2$O gas, or ultra-dry air (having a dew point of −40° C. or lower, preferably −60° C. or lower).

The electrical characteristics of a thin film transistor are improved using an oxide semiconductor film cooled slowly (or cooled) in an atmosphere which does not include moisture (having a dew point of −40° C. or lower, preferably −60° C. or lower) after moisture which is included in the film is reduced by heat treatment for dehydration or dehydrogenation, and a high-performance thin film transistor which can be mass-produced is realized.

In this specification, heat treatment in an inert gas atmosphere of nitrogen or a rare gas (such as argon or helium) is referred to as heat treatment for dehydration or dehydrogenation. In this specification, dehydrogenation does not refer to only elimination in the form of H$_2$ by the heat treatment, and dehydration or dehydrogenation also refers to elimination of H, OH, or the like for convenience.

In a light-emitting display device in which a light-emitting element is used, a plurality of thin film transistors are included in a pixel portion, and in the pixel portion, there is a portion where a gate electrode of a thin film transistor is connected to a source wiring or a drain wiring of another thin film transistor. In addition, in a driver circuit of the light-emitting display device in which a light-emitting element is used, there is a portion where a gate electrode of a thin film transistor is connected to a source wiring or a drain wiring of the thin film transistor.

Furthermore, since a thin film transistor is easily damaged by static electricity or the like, a protection circuit for protecting a thin film transistor in the pixel portion is preferably provided over the same substrate for a gate line or a source line. The protection circuit is preferably formed using a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

In a semiconductor device of an embodiment of the present invention, a driver circuit portion including a driver circuit TFT and a display portion including a pixel TFT are formed over one substrate. Therefore, manufacturing cost of the light-emitting device can be reduced.

Further, a light-emitting element which emits white light is formed over a substrate, so that a light-emitting device such as a lighting device can be manufactured. The lighting device is a lighting device using a light-emitting element which includes a layer containing a light-emitting substance with which electroluminescence (hereinafter referred to as EL) can be obtained.

Since the gate electrode layer, the gate insulating layer, the oxide semiconductor layer, the first electrode layer, the second electrode layer, and the oxide insulating layer of the first thin film transistor included in the pixel portion have a light-transmitting property, a large channel width can be maintained in addition to a high aperture ratio. As a result, on current supplied to the light-emitting element can be increased with a high definition secured; thus a light-emitting device with high luminance can be provided.

Further, the gate electrode layer including a gate electrode, the source electrode layer including a source electrode, and the drain electrode layer including a drain electrode of the second thin film transistor included in the driver circuit are formed using a wiring of metal with low electric resistance. As a result, wiring resistance is suppressed in a display device according to an embodiment of the present invention, and thus delay time can be shortened; accordingly, a high-definition display device in which writing time of a display image is shortened can be provided.

In this manner, a light-emitting device in which plural kinds of circuits are formed over one substrate and plural kinds of thin film transistors corresponding to characteristics of the plural kinds of circuits are provided can be provided.

Since an embodiment of the present invention includes a highly reliable thin film transistor having favorable electric characteristics as a switching element, a highly reliable light-emitting device can be provided.

An oxide semiconductor layer on which heat treatment for dehydration or dehydrogenation is performed is used, so that a highly reliable light-emitting device using a highly reliable thin film transistor having favorable electric characteristics as a switching element can be manufactured. A light-emitting device in which a pixel TFT and a driver circuit TFT which have different structures in accordance with their circuits are provided over one substrate can be manufactured.

BRIEF DESCRIPTION OF DRAWINGS

In the accompanying drawings:
FIGS. 5A1 and 5B1 are cross-sectional views and FIGS. 5A2 and 5B2 are plan views illustrating an embodiment of the present invention.

BEST MODE FOR CARRYING OUT THE INVENTION

Figure 1A:
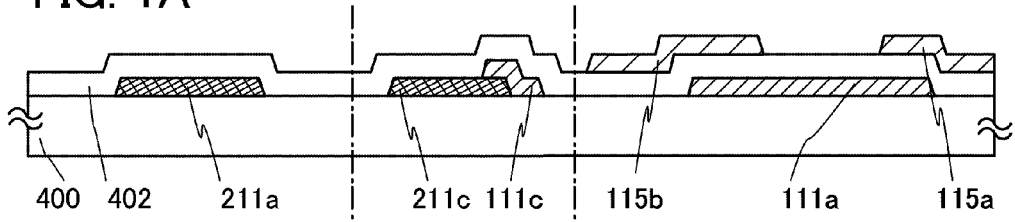
FIGS. 1A to 1E are cross-sectional process views illustrating an embodiment of the present invention.

Embodiments of the present invention will be described below in detail with reference to the accompanying drawings. However, the present invention is not limited to the description below, and it is easily understood by those skilled in the art that modes and details disclosed herein can be modified in various ways. Therefore, the present invention should not be construed as being limited to description of the embodiments. Note that in the drawings of this specification, the same portions or portions having a similar function are denoted by the same reference numerals, and description thereof may be omitted.

Embodiment 1

In Embodiment 1, one embodiment of a light-emitting device and a method for manufacturing the light-emitting device will be described with reference to FIGS. 1A to 1E. FIG. 1E illustrates an example of cross-sectional structures of two thin film transistors having different structures manufactured over one substrate.

In FIG. 1E, a thin film transistor 450 has a bottom-gate structure, and a thin film transistor 460 has a bottom-gate structure called a bottom-contact structure (also referred to as an inverted-coplanar structure).

The thin film transistor 460 provided in a pixel is a bottom-contact thin film transistor and includes, over a substrate 400 having an insulating surface, a gate electrode layer 111*a*, a gate insulating layer 402, an oxide semiconductor layer 123 including a channel formation region, a first electrode layer 115*a*, and a second electrode layer 115*b*. Further, an oxide insulating layer 407 which covers the thin film transistor 460 and is in contact with a top surface and a side surface of the oxide semiconductor layer 123 is provided.

Although the thin film transistor 460 provided in the pixel is described as a single-gate thin film transistor, a multi-gate thin film transistor having a plurality of channel formation regions can be used as necessary.

Note that the oxide semiconductor layer 123 is formed over the first electrode layer 115*a* and the second electrode layer 115*b* and overlaps with the first electrode layer 115*a* and the second electrode layer 115*b*. In addition, the oxide semiconductor layer 123 overlaps with the gate electrode layer 111*a* with the gate insulating layer 402 interposed therebetween. The channel formation region of the thin film transistor 460 provided in the pixel is a region of the oxide semiconductor layer 123, which is sandwiched between a side surface of the first electrode layer 115*a* and a side surface of the second electrode layer 115*b* that face to each other, that is, a region which is in contact with the gate insulating layer 402 and overlaps with the gate electrode layer 111*a*.

In order to realize a light-emitting device having a high aperture ratio, in which a light-transmitting thin film transistor is used as the thin film transistor 460, a light-transmitting conductive film is used for the first electrode layer 115*a* and the second electrode layer 115*b*.

In addition, a conductive film having a light-transmitting property with respect to visible light is also used for the gate electrode layer 111*a* of the thin film transistor 460. In this specification, a film having a light-transmitting property with respect to visible light refers to a film whose transmittance of visible light is 75% to 100%. In the case where such a film has conductivity, the film is also referred to as a transparent conductive film. Alternatively, a conductive film which is translucent with respective to visible light may be used. Translucence with respect to visible light refers to a visible light transmittance of 50% to 75%.

Further, the thin film transistor 450 provided in the driver circuit includes, over the substrate 400 having an insulating surface, a gate electrode layer 211*a*, the gate insulating layer 402, an oxide semiconductor layer, a source electrode layer 215*a*, and a drain electrode layer 215*b*. Note that the oxide semiconductor layer includes at least a channel formation region 223, a high-resistance source region 213*a*, and a high-resistance drain region 213*b*. Further, the oxide insulating layer 407 which is in contact with the channel formation region 223 is provided. Furthermore, a stacked structure may be formed by providing a protective insulating layer 408 over the oxide insulating layer 407.

In FIG. 1E, a region of the oxide semiconductor layer, which overlaps with the gate electrode layer and is sandwiched between and in contact with the oxide insulating layer 407 and the gate insulating layer 402 is referred to as the channel formation region. Note that a channel length L of the thin film transistor 450 is a length between end portions of the source electrode layer 215*a* and the drain electrode layer 215*b*, which are in contact with the oxide semiconductor layer and face to each other.

A process of manufacturing the thin film transistor 450 and the thin film transistor 460 over one substrate is described below with reference to FIGS. 1A to 1E.

After a conductive film is formed over the substrate 400 having an insulating surface, the gate electrode layer 211*a* and a gate electrode layer 211*c* are formed by a first photolithography step.

Note that a resist mask may be formed by an inkjet method. A photomask is not used when the resist mask is formed by an inkjet method, which results in reducing manufacturing cost.

As a material of the conductive film used for the gate electrode layers 211*a* and 211*c*, the following can be used: an element selected from Al, Cr, Ta, Ti, Mo, and W, an alloy containing any of these elements as its component, an alloy film containing any of these elements in combination, or the like.

When the temperature of heat treatment performed later is high, a glass substrate having a strain point of 730° C. or higher is preferably used. For the glass substrate, a glass material such as aluminosilicate glass, aluminoborosilicate glass, or barium borosilicate glass is used, for example. Note that by containing a larger amount of barium oxide (BaO) than boric acid, more practical heat-resistant glass can be obtained. Therefore, a glass substrate containing BaO and $B_2O_3$ so that the amount of BaO is larger than that of $B_2O_3$ is preferably used.

Note that instead of the above glass substrate, a substrate formed using an insulator such as a ceramic substrate, a quartz substrate, or a sapphire substrate may be used. Alternatively, crystallized glass or the like can be used.

Further, an insulating film serving as a base film may be provided between the substrate 400 and the gate electrode layers 211*a* and 211*c*. The base film has a function of preventing diffusion of an impurity element from the substrate 400, and can be formed to have a single-layer or stacked structure using one or more of a silicon nitride film, a silicon oxide film, a silicon nitride oxide film, and a silicon oxynitride film.

Next, a light-transmitting conductive film is formed so as to cover the gate electrode layers 211*a* and 211*c* and a second photolithography step is performed thereon to form the gate electrode layer 111*a* and a gate electrode layer 111*c*. In this embodiment, in order to reduce the wiring resistance, a gate wiring provided in a pixel portion is formed using the same metal conductive film as the gate electrode layer 211*c*, and a light-transmitting conductive film is used for the gate electrode layer 111*a* which overlaps the oxide semiconductor layer formed later with the gate insulating layer 402 interposed therebetween.

Next, the gate insulating layer 402 is formed over the gate electrode layers 211*a*, 211*c*, 111*a*, and 111*c*.

The gate insulating layer 402 can be formed using a single layer or stacked layers of any of a silicon oxide layer, a silicon nitride layer, a silicon oxynitride layer, and a silicon nitride oxide layer by a plasma CVD method, a sputtering method, or the like. Note that the layer may be doped with phosphorus (P) or boron (B).

For example, a silicon oxynitride layer may be formed using a deposition gas containing $SiH_4$, oxygen, and nitrogen by a plasma CVD method. The gate insulating layer 402 has a thickness of greater than or equal to 100 nm and less than or equal to 500 nm. In the case of a stacked structure, for example, a first gate insulating layer having a thickness of greater than or equal to 50 nm and less than or equal to 200 nm and a second gate insulating layer having a thickness of greater than or equal to 5 nm and less than or equal to 300 nm are stacked in this order.

In this embodiment, the gate insulating layer 402 is a silicon oxynitride (SiON (composition ratio: N<O)) layer which is formed to a thickness of 100 nm by a plasma CVD method.

Next, a light-transmitting conductive film is formed over the gate insulating layer 402, and then a third photolithography step is performed to form the first electrode layer 115*a* and the second electrode layer 115*b* (see FIG. 1A). The light-transmitting conductive film can be formed using a conductive material having a light-transmitting property with respect to visible light, such as an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide. The thickness of the light-transmitting conductive film is set in the range of greater than or equal to 50 nm less than or equal to 300 nm as appropriate. In addition, in the case where a sputtering method is used, it is preferable that deposition be performed using a target containing $SiO_2$ at greater than or equal to 2 weight % and less than or equal to 10 weight % and $SiO_x$ (x>0), which inhibits crystallization, be contained in the light-transmitting conductive film so that crystallization is suppressed when heat treatment for dehydration or dehydrogenation is performed in a later step.

Next, the gate insulating layer 402 is selectively etched by a fourth photolithography step, so that a contact hole reaching the gate electrode layer 211c is formed.

Next, over the gate insulating layer 402, an oxide semiconductor film is formed to a thickness of greater than or equal to 5 nm and less than or equal to 200 nm, preferably greater than or equal to 10 nm and less than or equal to 20 nm. The preferable thickness is 50 nm or less, so that the oxide semiconductor film can have an amorphous structure even when heat treatment for dehydration or dehydrogenation is performed after formation of the oxide semiconductor film. By formation of the oxide semiconductor film with a small thickness, crystallization of the oxide semiconductor layer in the case of performing heat treatment after its formation can be suppressed.

Any of the following is used as the oxide semiconductor film: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, an Sn—O-based oxide semiconductor film, and a Zn—O-based oxide semiconductor film. The oxide semiconductor film can be formed by a sputtering method in a rare gas (typically argon) atmosphere, an oxygen atmosphere, or an atmosphere of a rare gas (typically argon) and oxygen. In addition, in the case where a sputtering method is used, it is preferable that deposition be performed using a target containing $SiO_2$ at greater than or equal to 2 weight % and less than or equal to 10 weight % and $SiO_x$ (x>0), which inhibits crystallization, be contained in the oxide semiconductor film so that crystallization is suppressed when heat treatment for dehydration or dehydrogenation is performed in a later step.

Here, deposition is performed using an oxide semiconductor target containing In, Ga, and Zn (composition ratio: $In_2O_3$: $Ga_2O_3$:ZnO=1:1:1 [mol %], In:Ga:Zn=1:1:0.5 [at. %]) under conditions where the distance between the substrate and the target is 100 mm, the pressure is 0.6 Pa, the direct current (DC) power source is 0.5 kW, and the atmosphere is an oxygen atmosphere (of an oxygen flow rate of 100%). Note that a pulse direct current (DC) power source is preferable because dust can be reduced and the film thickness can be uniform. In this embodiment, as the oxide semiconductor film, a 15-nm-thick In—Ga—Zn—O-based non-single-crystal film is formed by a sputtering method with the use of an In—Ga—Zn—O-based oxide semiconductor target.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there is a multi-source sputtering apparatus in which a plurality of targets of different materials can be set. With the multi-source sputtering apparatus, films of different materials can be formed to be stacked in one chamber, or a film of plural kinds of materials can be formed by electric discharge at the same time in one chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are a reactive sputtering method in which a target substance and a sputtering gas component are chemically reacted with each other during deposition to form a thin compound film thereof, and a bias sputtering method in which voltage is also applied to a substrate during deposition.

Note that before the oxide semiconductor film is formed by a sputtering method, dust attached to a surface of the gate insulating layer 402 is preferably removed by reverse sputtering in which an argon gas is introduced and plasma is generated. The reverse sputtering refers to a method in which an RF power source is used for application of voltage to a substrate side in an argon atmosphere and plasma is generated in the vicinity of the substrate to modify a surface. Note that instead of an argon atmosphere, nitrogen, helium, oxygen, or the like may be used.

In this embodiment, the gate insulating layer is selectively etched by the fourth photolithography step to form the contact hole reaching the gate electrode layer 211c; however, the present invention is not particularly limited thereto. A contact hole reaching the gate electrode layer 211c may be formed with a resist mask formed over an oxide semiconductor layer after the oxide semiconductor film is etched; in that case, it is preferable that reverse sputtering be performed to remove resist residue or the like attached on the surface of the oxide semiconductor layer and the gate insulating layer 402.

Alternatively, the following process may be employed: an oxide semiconductor film is formed over the gate insulating layer, a resist mask is formed over the oxide semiconductor film, a contact hole reaching the gate electrode layer 211c is formed, the resist mask is then removed, and after that, another resist mask is formed over the oxide semiconductor film, and the oxide semiconductor film is selectively etched to be an island-shaped oxide semiconductor layer.

Before the oxide semiconductor film is formed, heat treatment (at higher than or equal to 400° C. and lower than the strain point of the substrate) may be performed in an atmosphere of an inert gas (such as nitrogen, helium, neon, or argon) so that impurities such as hydrogen and water, which are included in the gate insulating layer, are removed.

In this embodiment, the contact hole reaching the gate electrode layer 211c is formed by selectively etching the gate insulating layer by the fourth photolithography step; therefore, after the contact hole is formed, it is preferable that the oxide semiconductor film be formed after heat treatment (at higher than or equal to 400° C. and lower than 750° C.) is performed in an atmosphere of an inert gas (such as nitrogen, helium, neon, or argon) to remove impurities such as hydrogen and water contained in the layer.

Next, the oxide semiconductor film is processed into an island-shaped oxide semiconductor layer by a fifth photolithography step. As for etching conditions of the oxide semiconductor film, in the case where the selectivity of the oxide semiconductor film to the first electrode layer 115a and the second electrode layer 115b is not sufficient, a part of the first electrode layer 115a and a part of the second electrode layer 115b, which are not covered by a resist mask, may be partly or completely removed together with the oxide semiconductor film. In the case of complete removal, the oxide semiconductor layer is formed over the top surface of the conductive layer including the first electrode layer 115a and the second electrode layer 115b, and end portions of the conductive layer are aligned with end portions of the oxide semiconductor layer, as illustrated in an embodiment of FIG. 1B. Alternatively, in the case of partial removal, the thickness of the first electrode layer 115a and the second electrode layer 115b is smaller in a region extending beyond an edge of an island-shaped oxide semiconductor layer 113 than in a region overlapping with the island-shaped oxide semiconductor layer.

In addition, the resist mask for forming the island-shaped oxide semiconductor layer may be formed by an inkjet method. A photomask is not used when the resist mask is formed by an inkjet method, which results in reducing manufacturing cost.

Then, the oxide semiconductor layer is subjected to dehydration or dehydrogenation. First heat treatment for dehydration or dehydrogenation is performed at a temperature higher than or equal to 400° C. and lower than 750° C., preferably 425° C. or higher. Note that the heat treatment time may be 1 hour or shorter when the temperature of the heat treatment is 425° C. or higher, but is set to longer than 1 hour when the temperature of the heat treatment is lower than 425° C. Here, the substrate is introduced into an electric furnace which is one of heat treatment apparatuses, and the heat treatment is performed on the oxide semiconductor layer in a nitrogen atmosphere. After that, the oxide semiconductor layer is not exposed to air, which prevents water or hydrogen from entering the oxide semiconductor layer; thus, an oxide semiconductor layer is obtained. In this embodiment, the same furnace is used from the heating temperature T at which the oxide semiconductor layer is subjected to dehydration or dehydrogenation to a temperature sufficient to prevent entry of water; specifically, slow cooling is performed in a nitrogen atmosphere until the temperature drops by 100° C. or more from the heating temperature T. Without being limited to a nitrogen atmosphere, the dehydration or dehydrogenation is performed in an atmosphere of a rare gas such as helium, neon, or argon.

Note that the heat treatment apparatus is not limited to the electric furnace, and an apparatus for heating an object by heat conduction or heat radiation from a heater such as a resistance heater, or the like may be used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object by heat conduction from a heated gas. As the gas, an inert gas which does not react with an object by heat treatment, like nitrogen or a rare gas such as argon, is used.

It is preferable that nitrogen or a rare gas such as helium, neon, or argon do not include water, hydrogen, or the like in the first heat treatment. Alternatively, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

In some cases, the oxide semiconductor layer is crystallized to be a microcrystalline film or a polycrystalline film, depending on the condition of the first heat treatment or a material of the oxide semiconductor layer. For example, a microcrystalline oxide semiconductor film whose degree of crystallinity is 90% or higher or 80% or higher is formed in some cases. In addition, depending on the condition of the first heat treatment or a material of the oxide semiconductor layer, an amorphous oxide semiconductor film which contains no crystal components is formed in some cases.

Figure 1B:
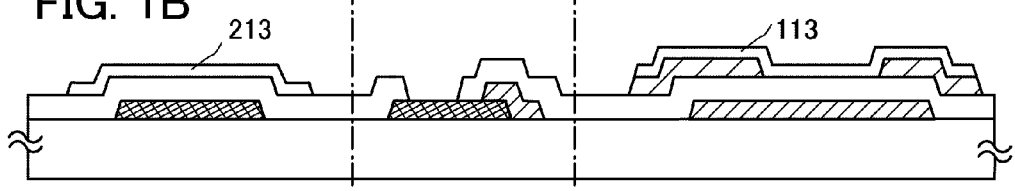

By the first heat treatment, an oxide semiconductor layer 213 and the oxide semiconductor layer 113 are changed to an oxygen-deficient type and the resistance thereof is reduced (see FIG. 1B). Through the first heat treatment, a carrier concentration of the oxide semiconductor layers 213 and 113 is increased as compared to that of the oxide semiconductor film immediately after the formation, preferably to $1\times10^{18}/cm^3$ or higher. Further, the gate electrode layer 111a and the gate electrode layer 111c are crystallized to be microcrystalline films or polycrystalline films in some cases, depending on the condition of the first heat treatment or a material of the gate electrode layers 111a and 111c. For example, when an indium oxide-tin oxide alloy film is used for the gate electrode layers 111a and 111c, the gate electrode layers 111a and 111c are crystallized by the first heat treatment at 450° C. for 1 hour; when an indium oxide-tin oxide alloy film containing silicon oxide is used for the gate electrode layers 111a and 111c, the gate electrode layers 111a and 111c are not crystallized by the first heat treatment.

The first heat treatment for the oxide semiconductor layers can be performed before the oxide semiconductor film is processed into the island-shaped oxide semiconductor layers. In that case, after the first heat treatment, the substrate is taken out of the heating apparatus and the fifth photolithography step is performed.

Figure 1C:
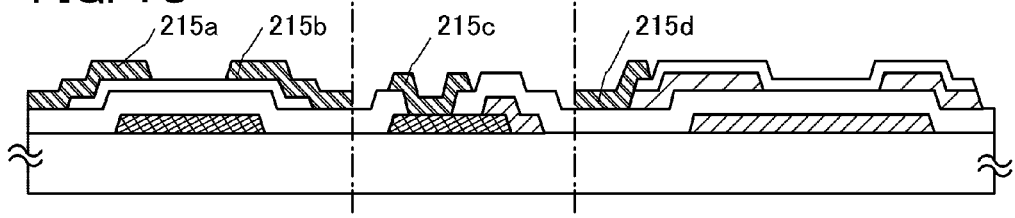
Figure 1D:
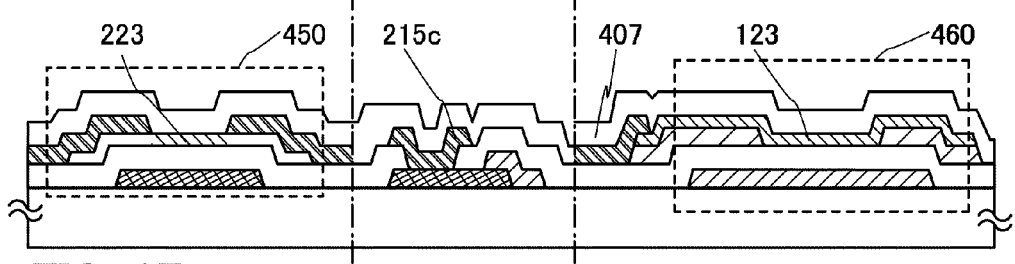
Figure 1E:
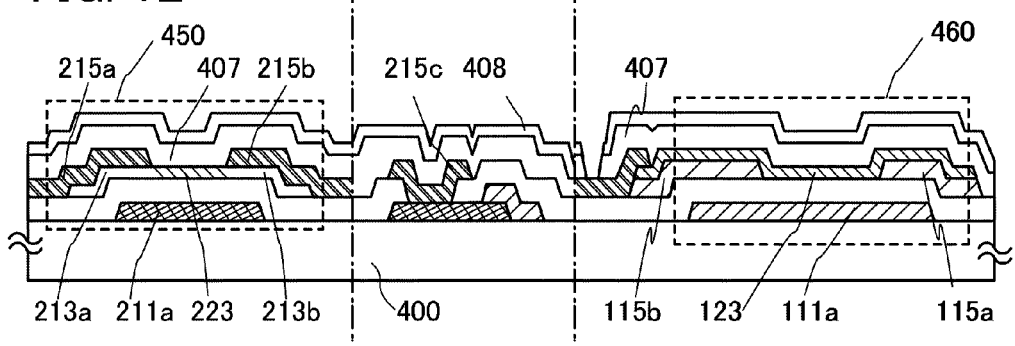

Next, after a conductive film is formed over the gate electrode layer 211c through the contact hole, the gate insulating layer 402, the first electrode layer 115a, the second electrode layer 115b, and the oxide semiconductor layers, a resist mask is formed and selective etching is performed by a sixth photolithography step, so that the source electrode layer 215a and the drain electrode layer 215b are formed (see FIG. 1C). Further, as illustrated in FIG. 1C, a connection electrode layer 215c which is electrically connected to the gate electrode layer 211c and a connection electrode layer 215d which is electrically connected to the second electrode layer 115b through the oxygen-deficient oxide semiconductor layer are formed. As a deposition method of the conductive film, a sputtering method, a vacuum evaporation method (such as an electron beam evaporation method), an arc discharge ion plating method, or a spray method is used. As a material of the conductive film, an element selected from Ti, Mo, W, Al, Cr, Cu, and Ta, an alloy containing any of these elements as a component, an alloy containing these elements in combination, or the like is used. The conductive film is not limited to a single layer containing the above element and may be a stack of two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a titanium film, a titanium nitride film may be used.

In the sixth photolithography step, only portions of the conductive film which are over and in contact with the oxide semiconductor layers are removed. Therefore, by using an ammonia peroxide mixture (31 wt % of hydrogen peroxide: 28 wt % of ammonia:water=5:2:2 in a weight ratio), or the like as an alkaline etchant so that only the portions of the conductive film which are over and in contact with the oxide semiconductor layers are removed, it is possible to remove the metal conductive film selectively and to leave the oxide semiconductor layers including an In—Ga—Zn—O-based oxide semiconductor.

Further, an exposed region of the oxide semiconductor layers (113 and 213) is etched in the sixth photolithography step in some cases, depending on the etching condition. In that case, the thickness of the oxide semiconductor layer in a region between the source electrode layer 215a and the drain electrode layer 215b is smaller than that of the oxide semiconductor layer in a region overlapping with the source electrode layer 215a or the drain electrode layer 215b.

Note that the resist mask for forming the source electrode layer 215a, the drain electrode layer 215b, and the connection electrode layers (215c and 215d) may be formed by an inkjet method. A photomask is not used when the resist mask is formed by an inkjet method, which results in reducing manufacturing cost.

Next, an oxide insulating film is formed over the gate insulating layer 402 and the oxide semiconductor layers (213 and 113) by a sputtering method to form the oxide insulating layer 407. At this stage, regions where the oxide semiconductor layers are in contact with the oxide insulating layer 407 are formed. Note that a region of the oxide semiconductor layer, which overlaps with the gate electrode layer and is sandwiched between and in contact with the oxide insulating layer 407 and the gate insulating layer 402, serves as a channel formation region.

The oxide insulating film can be formed to a thickness of at least 1 nm or more using a method by which impurities such as water or hydrogen are not included in the oxide insulating film, such as a sputtering method, as appropriate. In this embodiment, a silicon oxide film is formed as the oxide insulating film by a sputtering method. The substrate temperature in film formation may be higher than or equal to room temperature and lower than or equal to 300° C. and is 100° C. in this embodiment. The silicon oxide film can be formed by a sputtering method in a rare gas (typically argon) atmosphere, an oxygen atmosphere, or an atmosphere of a rare gas (typically argon) and oxygen. Further, a silicon oxide target or a silicon target can be used as a target. For example, with the use of a silicon target, a silicon oxide film can be formed by a sputtering method in an atmosphere of oxygen and a rare gas. As the oxide insulating film which is formed in contact with the oxide semiconductor layers whose resistance is reduced, an inorganic insulating film which does not include an impurity such as moisture, a hydrogen ion, or OH⁻ and blocks entry of these from the outside is used. Typically, a silicon oxide film, a silicon nitride oxide film, an aluminum oxide film, or an aluminum oxynitride film is used. Note that the oxide insulating film formed by a sputtering method is distinctively dense and even a single layer of the oxide insulating film can be used as a protective film for suppressing a phenomenon in which impurities are diffused into a layer in contact therewith. In addition, a target doped with phosphorus (P) or boron (B) can be used so that phosphorus (P) or boron (B) is added to the oxide insulating film.

In this embodiment, the film formation is performed by a pulsed DC sputtering method using a columnar polycrystalline, boron-doped silicon target which has a purity of 6N (the resistivity is 0.01 Ωcm), under the condition where the distance between the substrate and the target (T-S distance) is 89 mm, the pressure is 0.4 Pa, the direct-current (DC) power source is 6 kW, and the atmosphere is oxygen (the oxygen flow rate is 100%). The film thickness thereof is 300 nm.

Next, second heat treatment is performed in an inert gas atmosphere or a nitrogen gas atmosphere (preferably at higher than or equal to 200° C. and lower than or equal to 400° C., e.g., higher than or equal to 250° C. and lower than or equal to 350° C.) (see FIG. 1D). For example, the second heat treatment is performed at 250° C. for one hour in a nitrogen atmosphere. By the second heat treatment, a part of the oxide semiconductor layer 213 is heated while being in contact with the oxide insulating layer 407. Note that by the second heat treatment, the oxide semiconductor layer whose resistance is reduced by the first heat treatment is changed to an oxygen-excess type; thus, a high-resistance (i-type) oxide semiconductor layer can be obtained. At this time, in the case where the thickness of the oxide semiconductor layer is less than or equal to 15 nm, oxygen in the oxide semiconductor layer which overlaps with the source electrode layer 215a and the drain electrode layer 215b formed using a metal conductive film is likely to move to the metal conductive film side; accordingly, the whole oxide semiconductor layer becomes to have n-type conductivity. Further, in the case where the thickness of the oxide semiconductor layer is 30 nm to 50 nm, the vicinity of an interface between the oxide semiconductor layer and the metal conductive film becomes to have n-type conductivity, while the lower side thereof is in an i-type or n⁻-type state. Furthermore, the oxide insulating layer 407 is provided over and in contact with the region which serves as the channel formation region of the oxide semiconductor layer, and functions as a channel protective layer.

In addition, the timing of the second heat treatment is not limited to immediately after the sixth photolithography step, and is not particularly limited as long as it is performed after the sixth photolithography step.

Then, the protective insulating layer 408 is formed over the oxide insulating layer 407 (see FIG. 1E). The protective insulating layer 408 is formed using a silicon nitride film, a silicon nitride oxide film, an aluminum nitride film, or the like. In this embodiment, a silicon nitride film is formed as the protective insulating layer 408 by an RF sputtering method.

In addition, after the protective insulating layer 408 is formed, a resist mask is formed and selective etching is performed by a seventh photolithography step, so that a contact hole reaching the connection electrode layer 215d is formed.

Through the above process, two kinds of thin film transistors, the channel-etched thin film transistor 450 and the bottom-contact thin film transistor 460, can be manufactured over one substrate.

The gate electrode layer including a gate electrode, the source electrode layer including a source electrode, and the drain electrode layer including a drain electrode of the channel-etched thin film transistor 450 included in the driver circuit are formed using a wiring of metal with low electric resistance. Therefore, the wiring resistance of the light-emitting device is suppressed, and thus the light-emitting device can be driven with a short writing time. Moreover, since components of the bottom-contact thin film transistor 460, except for the connection electrode layer 215d, are formed using light-transmitting materials, the channel length can be increased with a high aperture ratio maintained. As a result, large current can be supplied to a light-emitting element with a high definition secured; thus the light-emitting device can have high luminance.

Note that thin film transistors having different structures can be arranged in one pixel of a light-emitting device. For example, a driver TFT that is electrically connected to a light-emitting element preferably has a structure with which large on current is obtained, while a switching TFT that is electrically connected to a gate electrode layer of the driver TFT preferably has a structure in which off current is suppressed. Thus, when a bottom-contact TFT having the same structure as the thin film transistor 460 is used as the driver TFT in a pixel portion, the channel width can be increased with a high aperture ratio maintained and thus large on current can be obtained. Further, a channel-etched TFT having the same structure as the thin film transistor 450 may be used as the switching TFT for the pixel portion. Note that the switching TFT does not need to be supplied with large current and thus can be made smaller than the driver TFT; consequently, the aperture ratio is less likely to be reduced.

Further, in the case where a light-emitting device is manufactured, a power supply line which is electrically connected to the source electrode layer of the driver TFT is provided. The power supply line intersects with a gate wiring and is formed using the same material and through the same process as the connection electrode layer 215c formed using a metal conductive film. Alternatively, the power supply line intersects with a source wiring and is formed using the same material and through the same process as the gate electrode layer 211c.

Further, in the case where a light-emitting device is manufactured, one electrode of the light-emitting element is electrically connected to the drain electrode layer of the driver TFT, and a common potential line which is electrically connected to the other electrode of the light-emitting element is provided. Note that the common potential line is formed using the same material and through the same process as the connection electrode layer 215c formed using a metal conductive film. Alternatively, the common potential line is formed using the same material and through the same process as the gate electrode layer 211c.

Further, in the case where a light-emitting device is manufactured, a plurality of thin film transistors is provided in one pixel, and a connection portion which connects the gate electrode layer of one thin film transistor to the drain electrode layer of another thin film transistor is provided. This connection portion is formed through the same process as the connection electrode layer 215c which is electrically connected to the gate electrode layer 211c.

According to this embodiment, a driver circuit and a pixel portion can be formed to be optimized by selecting the channel-etched thin film transistor 450 or the bottom-contact thin film transistor 460 in consideration of characteristics required for the driver circuit and the pixel portion, or those of a driver TFT and a selection TFT in the pixel portion.

This embodiment can be freely combined with any of the other embodiments.

Embodiment 2

In this embodiment, an example of manufacturing an active matrix light-emitting display device using the plurality of thin film transistors described in Embodiment 1 and a light-emitting element utilizing electroluminescence will be described.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description here is made using an organic EL element as a light-emitting element.

Figure 2:
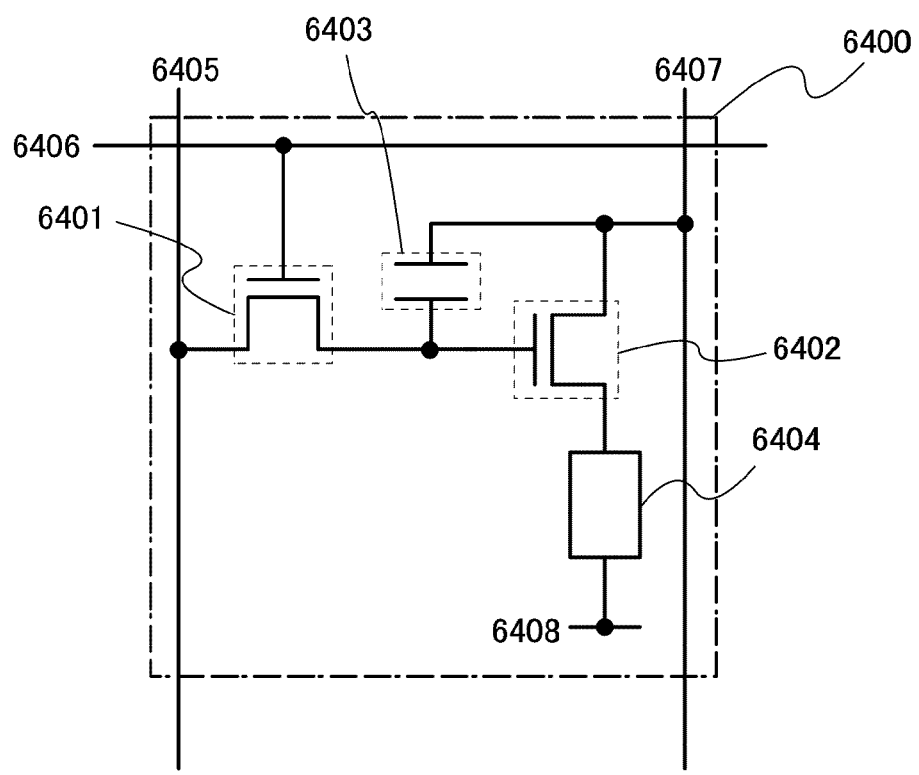
FIG. 2 illustrates an example of a pixel configuration.

FIG. 2 illustrates an example of a pixel configuration to which digital time grayscale driving can be applied, as an example of a semiconductor device.

A configuration and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. In order to make the light-emitting element 6404 emit light, each potential is set so that the potential difference between the high power supply potential and the low power supply potential is higher than or equal to forward threshold voltage of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, voltage higher than the voltage of the power supply line 6407 is applied to the gate of the driver transistor 6402. Note that voltage higher than or equal to (voltage of the power supply line+$V_{th}$ of the driver transistor 6402) is applied to the signal line 6405.

In the case of performing analog grayscale driving instead of the digital time grayscale driving, the same pixel configuration as in FIG. 2 can be employed by inputting signals in a different way.

In the case of performing analog grayscale driving, voltage higher than or equal to (forward voltage of the light-emitting element 6404+$V_{th}$ of the driver transistor 6402) is applied to the gate of the driver transistor 6402. The forward voltage of the light-emitting element 6404 indicates voltage at which a desired luminance is obtained, and includes at least forward threshold voltage. A video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel configuration illustrated in FIG. 2 is not limited thereto. For example, the pixel in FIG. 2 may further include a switch, a resistor, a capacitor, a transistor, a logic circuit, or the like.

Next, structures of the light-emitting element are described with reference to FIGS. 3A to 3C. A cross-sectional structure of a pixel is described here by taking an n-channel driver TFT as an example. Driver TFTs 7011, 7021, and 7001 which are TFTs used for semiconductor devices illustrated in FIGS. 3A, 3B, and 3C, respectively, can be formed in a manner similar to that of the thin film transistor described in Embodiment 1 and are highly reliable thin film transistors each including an oxide semiconductor layer.

In order to extract light emitted from the light-emitting element, at least one of an anode and a cathode is required to transmit light. A thin film transistor and the light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel configuration can be applied to a light-emitting element having any of these emission structures.

Next, a light-emitting element having a bottom emission structure is described with reference to FIG. 3A.

Figure 3A:
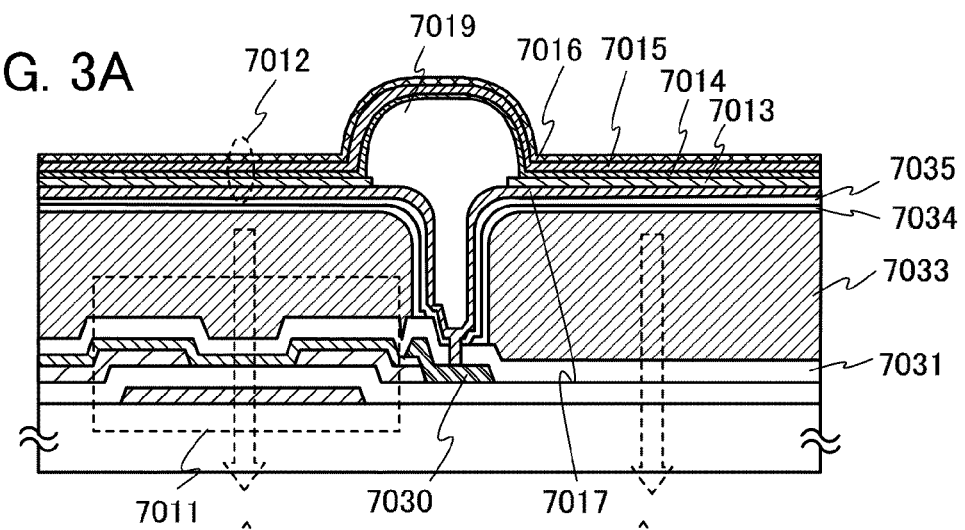
FIGS. 3A to 3C are cross-sectional views each illustrating an embodiment of the present invention.

FIG. 3A is a cross-sectional view of a pixel in the case where the driver TFT 7011 is an n-channel transistor and light is emitted from a light-emitting element 7012 to a first electrode 7013 side. In FIG. 3A, the first electrode 7013 of the light-emitting element 7012 is formed over a light-transmitting conductive film 7017 which is electrically connected to the driver TFT 7011 through a connection electrode layer 7030, and an EL layer 7014 and a second electrode 7015 are stacked in this order over the first electrode 7013. Note that the connection electrode layer 7030 is electrically connected to a drain electrode layer of the driver TFT 7011.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Further, the first electrode 7013 of the light-emitting element can be formed using a variety of materials. For example, in the case of using the first electrode 7013 as a cathode, a material having a low work function is preferably used; specifically, for example, alkali metal such as Li or Cs, alkaline earth metal such as Mg, Ca, or Sr, or an alloy containing any of these (such as Mg:Ag or Al:Li), rare earth metal such as Yb or Er, or the like is preferable. In FIG. 3A, the thickness of the first electrode 7013 is approximately a thickness that transmits light (preferably, approximately 5 nm to 30 nm). For example, an aluminum film having a thickness of 20 nm is used for the first electrode 7013.

Note that the light-transmitting conductive film and the aluminum film may be stacked and then selectively etched to form the light-transmitting conductive film 7017 and the first electrode 7013; in this case, etching can be performed using the same mask, which is preferable.

A peripheral portion of the first electrode 7013 is covered with a partition wall 7019. The partition wall 7019 is formed using a film of an organic resin such as polyimide, acrylic, polyamide, or epoxy, an inorganic insulating film, or organic polysiloxane. It is particularly preferable that the partition wall 7019 be formed using a photosensitive resin material to have an opening over the first electrode 7013 so that a sidewall of the opening is formed as an inclined surface with continuous curvature. When a photosensitive resin material is used for the partition wall 7019, a step of forming a resist mask can be omitted.

The EL layer 7014 formed over the first electrode 7013 and the partition wall 7019 may include at least a light-emitting layer and may be formed as a single layer or a plurality of layers stacked. When the EL layer 7014 can be formed using a plurality of layers, an electron-injection layer, an electron-transport layer, a light-emitting layer, a hole-transport layer, and a hole-inject layer are stacked in this order over the first electrode 7013 functioning as a cathode. It is not necessary to form all of these layers.

The stacking order is not limited to the above. The first electrode 7013 may function as an anode, and a hole-injection layer, a hole-transport layer, a light-emitting layer, an electron-transport layer, and an electron-injection layer may be stacked in this order over the first electrode 7013. When power consumption is compared, the structure where the first electrode 7013 functions as a cathode and an electron-injection layer, an electron-transport layer, a light-emitting layer, a hole-transport layer, and a hole-injection layer are stacked in this order over the first electrode 7013 is preferable because voltage increase in the driver circuit portion and power consumption can be suppressed.

Further, the second electrode 7015 which is formed over the EL layer 7014 can be formed using a variety of materials. For example, in the case of using the second electrode 7015 as an anode, a material having a high work function such as ZrN, Ti, W, Ni, Pt, Cr, or a transparent conductive material such as ITO, IZO, or ZnO is preferably used. For a blocking film 7016 over the second electrode 7015, for example, metal which blocks light, metal which reflects light, or the like is used. In this embodiment, an ITO film is used for the second electrode 7015, and a Ti film is used as the blocking film 7016.

The light-emitting element 7012 corresponds to a region where the EL layer 7014 including a light-emitting layer is sandwiched between the first electrode 7013 and the second electrode 7015. In the case of the element structure illustrated in FIG. 3A, light is emitted from the light-emitting element 7012 to the first electrode 7013 side as indicated by arrows.

Note that an example in which a light-transmitting conductive film is used for a gate electrode layer is illustrated in FIG. 3A. Light emitted from the light-emitting element 7012 passes through a color filter layer 7033 and the gate electrode layer and a source electrode layer of the driver TFT 7011 to be emitted to the outside. By using a light-transmitting conductive film for the gate electrode layer and the source electrode layer of the driver TFT 7011, the aperture ratio can be improved.

The color filter layer 7033 is formed by a droplet discharge method such as an inkjet method, a printing method, an etching method with the use of a photolithography technique, or the like.

The color filter layer 7033 is covered with an overcoat layer 7034, and further covered with a protective insulating layer 7035. Note that the overcoat layer 7034 with a small thickness is illustrated in FIG. 3A; however, the overcoat layer 7034 has a function to planarize roughness due to the color filter layer 7033.

A contact hole which is formed in the protective insulating layer 7035, the overcoat layer 7034, the color filter layer 7033, and an oxide insulating layer 7031 and reaches the connection electrode layer 7030 is provided in a position overlapping with the partition wall 7019. FIG. 3A illustrates an example of using a metal conductive film for the connection electrode layer 7030; therefore, when the contact hole reaching the connection electrode layer 7030, the partition wall 7019, and the connection electrode layer 7030 are disposed so as to overlap with one another, the aperture ratio can be improved.

Next, a light-emitting element having a dual emission structure is described with reference to FIG. 3B.

Figure 3B:
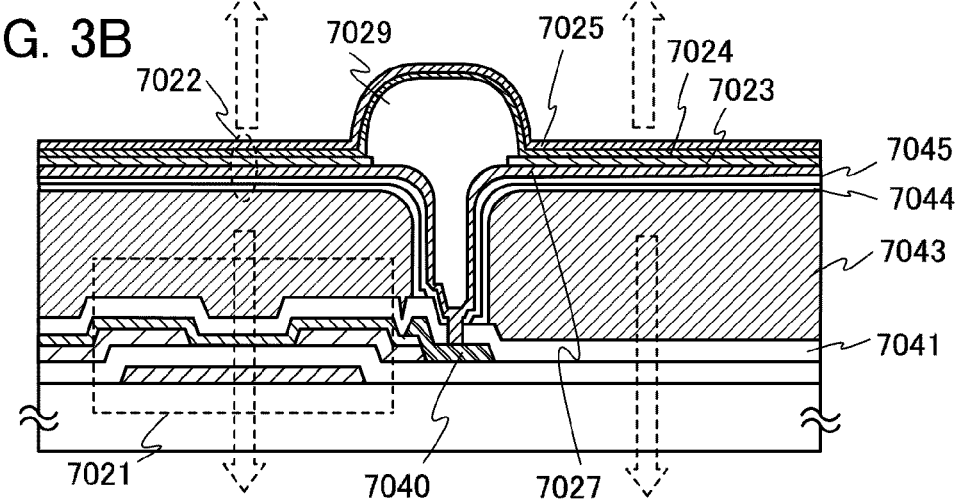

In FIG. 3B, a first electrode 7023 of a light-emitting element 7022 is formed over a light-transmitting conductive film 7027 which is electrically connected to the driver TFT 7021 through a connection electrode layer 7040, and an EL layer 7024 and a second electrode 7025 are stacked in this order over the first electrode 7023. Note that the connection electrode layer 7040 is electrically connected to a drain electrode layer of the driver TFT 7021.

For the light-transmitting conductive film 7027, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

Further, the first electrode 7023 can be formed using a variety of materials. For example, in the case of using the first electrode 7023 as a cathode, a material having a low work function is preferably used; specifically, for example, alkali metal such as Li or Cs, alkaline earth metal such as Mg, Ca, or Sr, an alloy containing any of these (such as Mg:Ag or Al:Li), rare earth metal such as Yb or Er, or the like is preferable. In this embodiment, the first electrode 7023 is used as a cathode, and the thickness thereof is a thickness that transmits light (preferably, approximately 5 nm to 30 nm). For example, a 20-nm-thick aluminum film is used as the cathode.

Note that the light-transmitting conductive film and the aluminum film may be stacked and then selectively etched to form the light-transmitting conductive film 7027 and the first electrode 7023; in this case, etching can be performed with the use of the same mask, which is preferable.

The peripheral portion of the first electrode 7023 is covered with a partition wall 7029. The partition wall 7029 is formed using a film of an organic resin such as polyimide, acrylic, polyamide, or epoxy, an inorganic insulating film, or organic polysiloxane. It is particularly preferable that the partition wall 7029 be formed using a photosensitive resin material to have an opening over the first electrode 7023 so that a sidewall of the opening is formed as an inclined surface with continuous curvature. When a photosensitive resin material is used for the partition wall 7029, a step of forming a resist mask can be omitted.

The EL layer 7024 formed over the first electrode 7023 and the partition wall 7029 may include a light-emitting layer and may be formed as a single layer or a plurality of layers stacked. When the EL layer 7024 is formed using a plurality of layers, an electron-injection layer, an electron-transport layer, a light-emitting layer, a hole-transport layer, and a hole-injection layer are stacked in this order over the first electrode 7023 functioning as a cathode. It is not necessary to form all of these layers.

The stacking order is not limited to the above. The first electrode 7023 may be used as an anode, and a hole-injection layer, a hole-transport layer, a light-emitting layer, an electron-transport layer, and an electron-injection layer may be stacked in this order over the anode. However, when power consumption is compared, the structure where the first electrode 7023 is used as a cathode and an electron-injection layer, an electron-transport layer, a light-emitting layer, a hole-transport layer, and a hole-injection layer are stacked in this order over the cathode is preferable because of lower power consumption.

Further, the second electrode 7025 which is formed over the EL layer 7024 can be formed using a variety of materials. For example, in the case of using the second electrode 7025 as an anode, a material having a high work function like a transparent conductive material such as ITO, IZO, or ZnO is preferably used. In this embodiment, the second electrode 7025 is used as an anode and formed using an ITO film containing silicon oxide.

The light-emitting element 7022 corresponds to a region where the EL layer 7024 including a light-emitting layer is sandwiched between the first electrode 7023 and the second electrode 7025. In the case of the element structure illustrated in FIG. 3B, light is emitted from the light-emitting element 7022 to both the second electrode 7025 side and the first electrode 7023 side as indicated by arrows.

Note that an example in which the light-transmitting conductive film is used for a gate electrode layer and a source electrode layer is illustrated in FIG. 3B. Light emitted from the light-emitting element 7022 to the first electrode 7023 side passes through a color filter layer 7043 and the gate electrode layer and the source electrode layer of the driver TFT 7021 to be emitted to the outside. When a light-transmitting conductive film is used for the gate electrode layer and the source electrode layer of the driver TFT 7021, the aperture ratio on the second electrode 7025 side can be substantially the same as the aperture ratio on the first electrode 7023 side.

The color filter layer 7043 is formed by a droplet discharge method such as an inkjet method, a printing method, an etching method with the use of a photolithography technique, or the like.

The color filter layer 7043 is covered with an overcoat layer 7044, and further covered with a protective insulating layer 7045.

A contact hole which is formed in the protective insulating layer 7045, the overcoat layer 7044, the color filter layer 7043, and an oxide insulating layer 7041 and reaches the connection electrode layer 7040 is provided in a position overlapping with the partition wall 7029. FIG. 3B illustrates an example of using a metal conductive film for the connection electrode layer 7040; therefore, when the contact hole reaching the connection electrode layer 7040, the partition wall 7029, and the connection electrode layer 7040 are disposed so as to overlap with one another, the aperture ratio on the second electrode 7025 side can be substantially the same as the aperture ratio on the first electrode 7023 side.

Note that when a light-emitting element having a dual emission structure is used and full color display is performed on both display surfaces, light from the second electrode 7025 side does not pass through the color filter layer 7043; therefore, a sealing substrate provided with another color filter layer is preferably provided above the second electrode 7025.

Next, a light-emitting element having a top emission structure is described with reference to FIG. 3C.

Figure 3C:
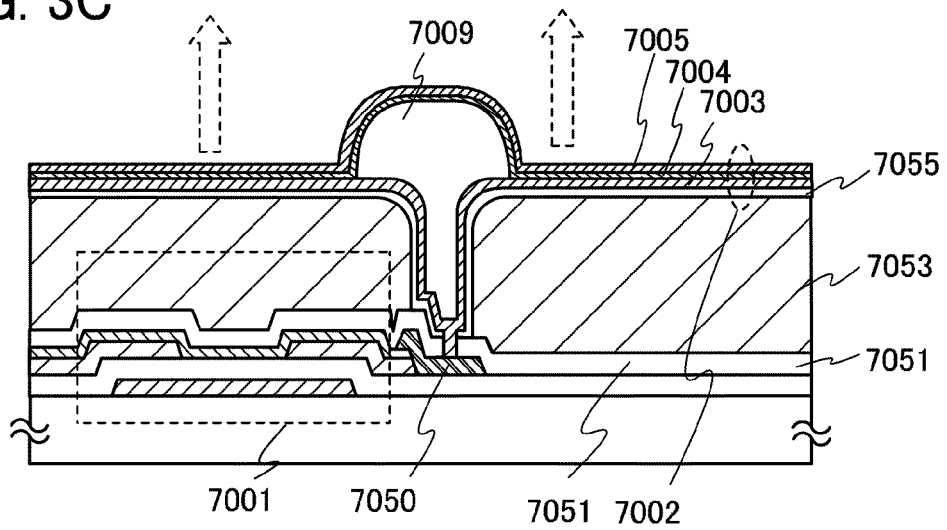

FIG. 3C is a cross-sectional view of a pixel in the case where the driver TFT 7001 is an n-channel TFT and light is emitted from a light-emitting element 7002 to a second electrode 7005 side. In FIG. 3C, a first electrode 7003 of the light-emitting element 7002 which is electrically connected to the driver TFT 7001 through a connection electrode layer 7050 is formed, and an EL layer 7004 and the second electrode 7005 are stacked in this order over the first electrode 7003.

Further, the first electrode 7003 can be formed using a variety of materials. For example, in the case of using the first electrode 7003 as a cathode, a material having a low work function is preferably used; specifically, for example, alkali metal such as Li or Cs, alkaline earth metal such as Mg, Ca, or Sr, an alloy containing any of these (such as Mg:Ag or Al:Li), rare earth metal such as Yb or Er, or the like is preferable.

The peripheral portion of the first electrode 7003 is covered with a partition wall 7009. The partition wall 7009 is formed using a film of an organic resin such as polyimide, acrylic, polyamide, or epoxy, an inorganic insulating film, or organic polysiloxane. It is particularly preferable that the partition wall 7009 be formed using a photosensitive resin material to have an opening over the first electrode 7003 so that a sidewall of the opening is formed as an inclined surface with continuous curvature. When a photosensitive resin material is used for the partition wall 7009, a step of forming a resist mask can be omitted.

The EL layer 7004 formed over the first electrode 7003 and the partition wall 7009 may include at least a light-emitting layer and may be formed as a single layer or a plurality of layers stacked. When the EL layer 7004 is formed using a plurality of layers, an electron-injection layer, an electron-transport layer, a light-emitting layer, a hole-transport layer, and a hole-injection layer are stacked in this order over the first electrode 7003 used as a cathode. It is not necessary to form all of these layers.

The stacking order is not limited to the above, and a hole-injection layer, a hole-transport layer, a light-emitting layer, an electron-transport layer, and an electron-injection layer may be stacked in this order over the first electrode 7003 used as an anode.

In FIG. 3C, a hole-injection layer, a hole-transport layer, a light-emitting layer, an electron-transport layer, and an electron-injection layer are stacked in this order over a stacked film in which a Ti film, an aluminum film, and a Ti film are stacked in this order. Further, a stacked layer of a Mg:Ag alloy thin film and ITO is formed thereover.

Note that in the case where the TFT 7001 is an n-channel TFT, a structure in which an electron-injection layer, an electron-transport layer, a light-emitting layer, a hole-transport layer, and a hole-injection layer are stacked in this order over the first electrode 7003 is preferable because voltage increase in the driver circuit and power consumption can be suppressed.

The second electrode 7005 is formed using a light-transmitting conductive material. For example, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added may be used.

The light-emitting element 7002 corresponds to a region where the EL layer 7004 including a light-emitting layer is sandwiched between the first electrode 7003 and the second electrode 7005. In the case of the pixel illustrated in FIG. 3C, light is emitted from the light-emitting element 7002 to the second electrode 7005 side as indicated by arrows.

In FIG. 3C, an example in which the thin film transistor 460 is used as the TFT 7001 is illustrated; however, the thin film transistor 450 can be used without particular limitation. When the thin film transistor 450 is used as the TFT 7001, the first electrode 7003 and a drain electrode layer are electrically connected so as to be in contact with each other.

In FIG. 3C, the drain electrode layer of the TFT 7001 is electrically connected to the connection electrode layer 7050, and the connection electrode layer 7050 is electrically connected to the first electrode 7003 through a contact hole formed in a planarization insulating layer 7053, a protective insulating layer 7055, and an oxide insulating layer 7051. The planarization insulating layer 7053 can be formed using a resin material such as polyimide, acrylic, benzocyclobutene, polyamide, or epoxy. In addition to such resin materials, it is possible to use a low-dielectric constant material (low-k material), a siloxane-based resin, phosphosilicate glass (PSG), borophosphosilicate glass (BPSG), or the like. Note that the planarization insulating layer 7053 may be formed by stacking a plurality of insulating films formed using any of these materials. There is no particular limitation on the method for forming the planarization insulating layer 7053. Depending on the material, the planarization insulating layer 7053 can be formed by a method such as sputtering method, an SOG method, a spin coating method, a dipping method, a spray coating method, or a droplet discharge method (such as an inkjet method, screen printing, or offset printing), or by using a tool such as a doctor knife, a roll coater, a curtain coater, or a knife coater.

In the structure of FIG. 3C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include a white light-emitting element in addition to the three kinds of light-emitting elements.

In the structure of FIG. 3C, a light-emitting display device capable of full color display may be manufactured in such a manner that all of a plurality of light-emitting elements which is arranged is white light-emitting elements and a sealing substrate having a color filter or the like is arranged above the light-emitting element 7002. A material which exhibits monochromatic light such as white light is formed and combined with a color filter or a color conversion layer, whereby full color display can be performed.

Needless to say, display of monochromatic light emission may be performed. For example, a lighting device may be formed with the use of white light emission, or an area-color light-emitting device may be formed with the use of monochromatic light emission.

If necessary, an optical film such as a polarizing film like a circularly polarizing plate may be provided.

Note that, although the organic EL elements are described here as the light-emitting elements, an inorganic EL element can also be provided as a light-emitting element.

Note that the example is described in which a thin film transistor (a driver TFT) which controls the driving of a light-emitting element is electrically connected to the light-emitting element; however, a structure may be employed in which a TFT for current control is connected between the driver TFT and the light-emitting element.

This embodiment can be freely combined with any of the other embodiments.

Embodiment 3

In this embodiment, an example in which a pixel portion and a driver circuit are formed over one substrate by using the plurality of thin film transistors described in Embodiment 1 to manufacture an active matrix light-emitting display device will be described.

In this embodiment, not only cross sections of two thin film transistors and a connection portion, which are illustrated in Embodiment 1, but also a wiring intersection portion and a capacitor are illustrated for description.

Figure 4:
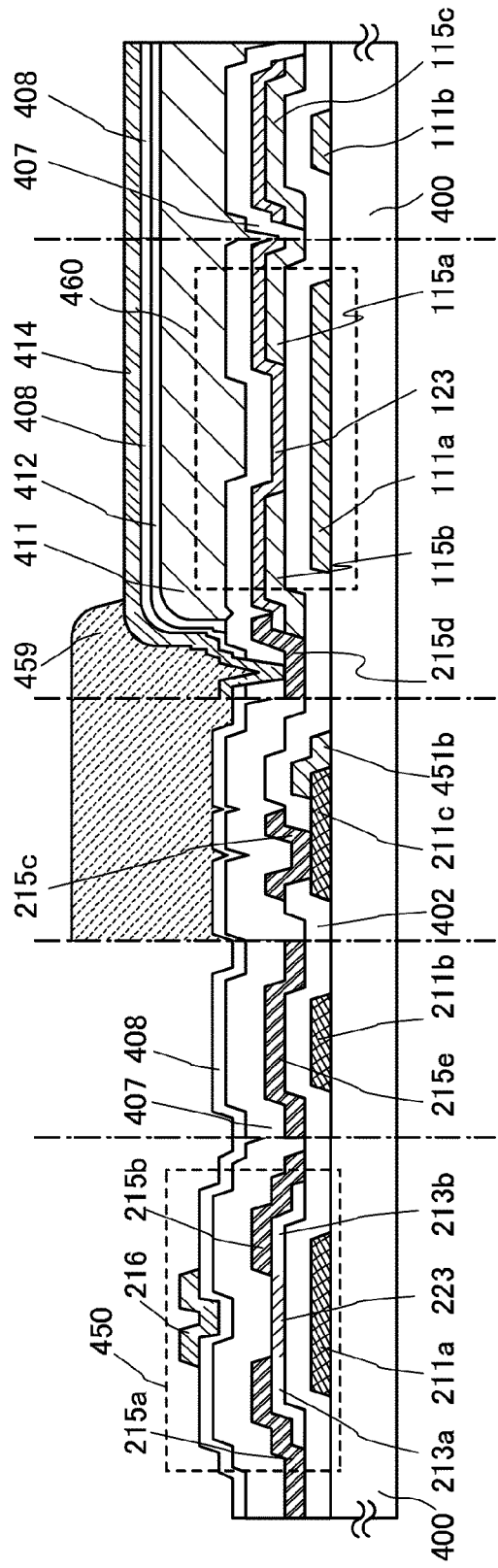
FIG. 4 is a cross-sectional view illustrating an embodiment of the present invention.

FIG. 4 is a cross-sectional view of a state of a substrate before an EL layer is formed over a first electrode (a pixel electrode). Note that the same portions as FIG. 1E are denoted by the same reference numerals.

In FIG. 4, a driver TFT which is electrically connected to a first electrode 414 is the bottom-contact thin film transistor 460 and, in this embodiment, can be manufactured in accordance with Embodiment 1.

After the oxide insulating layer 407 is formed in accordance with Embodiment 1, a green color filter layer 411, a blue color filter layer, and a red color filter layer are sequentially formed. Note that an oxide insulating film formed by a sputtering method is distinctively dense and even a single layer of the oxide insulating film can be used as a protective film for suppressing a phenomenon in which impurities are diffused into a layer in contact therewith. Each of the color filter layers is formed by a printing method, an inkjet method, an etching method with the use of a photolithography technique, or the like. By providing the color filter layers over a substrate provided with a TFT, the color filter layers can be aligned with light-emitting regions of light-emitting elements with high accuracy, without dependence on the bonding accuracy of a sealing substrate.

Next, an overcoat layer 412 is formed to cover the green color filter layer 411, the blue color filter layer, and the red color filter layer. For the overcoat layer 412, a light-transmitting resin is used.

Here, an example in which full color display is performed using three colors of RGB is described; however, an embodiment of the present invention is not particularly limited thereto, and full color display may be performed using four colors of RGBW.

Next, the protective insulating layer 408 is formed to cover the overcoat layer 412 and the oxide insulating layer 407. For the protective insulating layer 408, an inorganic insulating film such as a silicon nitride film, an aluminum nitride film, a silicon nitride oxide film, or an aluminum oxynitride film is used.

Next, the protective insulating layer 408 and the oxide insulating layer 407 are selectively etched by a photolithography step, so that a contact hole reaching the connection electrode layer 215d is formed. By this photolithography step, the protective insulating layer 408 and the oxide insulating layer 407 in a terminal portion are also etched, so that a part of a terminal electrode is exposed. In addition, in order to connect a second electrode of the light-emitting element formed later with a common potential line, a contact hole reaching the common potential line is formed.

Then, a light-transmitting conductive film is formed, and the first electrode 414 which is electrically connected to the connection electrode layer 215d is formed by a photolithography step.

Next, a partition wall 459 is formed so as to cover a peripheral portion of the first electrode 414. The partition wall 459 can be formed using a film of an organic resin such as polyimide, acrylic, polyamide, or epoxy, an inorganic insulating film, or organic polysiloxane. The partition wall 459 is formed particularly using a photosensitive resin material to have an opening over the first electrode 414 so that a sidewall of the opening is formed as an inclined surface with continuous curvature. When the partition wall 459 is formed using a photosensitive resin material, a step of forming a resist mask can be omitted.

Through the above process, the substrate in the state illustrated in FIG. 4 can be obtained. In a subsequent process of forming the light-emitting element, as described in Embodiment 2 as an example, an EL layer is formed over the first electrode 414, and the second electrode is formed over the EL layer. Note that the second electrode is electrically connected to the common potential line.

In a pixel portion, a capacitor portion is formed as illustrated in FIG. 4. The capacitor portion illustrated in FIG. 4 is formed with a capacitor wiring layer 111b and a capacitor electrode layer 115c, in which the gate insulating layer 402 serves as a dielectric. Further, in the light-emitting device, the capacitor wiring layer 111b is part of a power supply line and the capacitor electrode layer 115c is part of a gate electrode layer of a pixel TFT.

Note that although FIG. 4 illustrates an example in which a gate wiring layer 211b is formed using a metal conductive film, the gate wiring layer 211b can also be formed using the same light-transmitting conductive film as the gate electrode layer 111a of the thin film transistor 460. Further, a wiring layer 215e is formed using the same conductive layer as the connection electrode layers (215c and 215d) and intersect with the gate wiring layer 211b with the gate insulating film interposed between the wiring layer 215e and the gate wiring layer 211b.

In addition, in FIG. 4, at least one of TFTs arranged in the driver circuit is the channel-etched thin film transistor 450 and, in this embodiment, can be manufactured in accordance with Embodiment 1.

Further, a conductive layer 216 may be provided above the oxide semiconductor layer of the thin film transistor 450 in the driver circuit. The conductive layer 216 can be formed using the same material and through the same process as the first electrode 414.

The conductive layer 216 is provided so as to overlap with the channel formation region 223 of the oxide semiconductor layer, whereby in a bias-temperature stress test (hereinafter referred to as a BT test) for examining the reliability of a thin film transistor, the amount of change in the threshold voltage of the thin film transistor 450 before and after the BT test can be reduced. The potential of the conductive layer 216 may be the same as or different from that of the gate electrode layer 211a. The conductive layer 216 can also function as a second gate electrode layer. Alternatively, the potential of the conductive layer 216 may be GND or 0 V, or the conductive layer 216 may be in a floating state. The thin film transistor 450 provided with the conductive layer 216 functions as a transistor having four terminals.

Since a thin film transistor is easily damaged due to static electricity or the like, a protection circuit is preferably provided over the same substrate as the pixel portion or the drive circuit. The protection circuit is preferably formed using a non-linear element including an oxide semiconductor layer. For example, protection circuits are provided between the pixel portion and a scan line input terminal and between the pixel portion and a signal line input terminal. In this embodiment, a plurality of protection circuits is provided so as to prevent the pixel transistor and the like from being damaged when surge voltage due to static electricity or the like is applied to a scan line, a signal line, and a capacitor bus line. Therefore, the protection circuit is formed so as to release charge to a common wiring when surge voltage is applied. Further, the protection circuit includes non-linear elements arranged in parallel to each other with the scan line therebetween. The non-linear elements each include a two-terminal element such as a diode or a three-terminal element such as a transistor. For example, the non-linear elements can be formed through the same process as the thin film transistor 460 in the pixel portion, and can have the same properties as a diode by connecting a gate terminal to a drain terminal of the non-linear elements.

This embodiment can be freely combined with Embodiment 1 or 2.

Embodiment 4

In this embodiment, an example of a structure of a terminal portion provided over the same substrate as the thin film transistor will be described with reference to FIGS. 5A1, 5A2, 5B1, and 5B2. Note that in FIGS. 5A1, 5A2, 5B1, and 5B2, the same portions as FIG. 4 are denoted by the same reference numerals.

FIGS. 5A1 and 5A2 are a cross-sectional view and a top view of a gate wiring terminal portion, respectively. FIG. 5A1 is a cross-sectional view taken along line C1-C2 of FIG. 5A2. In FIG. 5A1, a conductive layer 415 formed over a stack of the oxide insulating layer 407 and the protective insulating layer 408 is a connection terminal electrode which functions as an input terminal. Further, in the terminal portion of FIG. 5A1, a first terminal 417 formed using the same material as the gate wiring layer 211b and a connection electrode layer 215f formed using the same material as a source wiring layer including the source electrode layer 215a overlap with each other with the gate insulating layer 402 interposed therebetween, and are electrically connected to each other through the conductive layer 415. The conductive layer 415 can be formed using the same light-transmitting material and through the same process as the first electrode 414.

FIGS. 5B1 and 5B2 are a cross-sectional view and a top view of a source wiring terminal portion, respectively. FIG. 5B1 is a cross-sectional view taken along line C3-C4 of FIG. 5B2. In FIG. 5B1, a conductive layer 418 formed over a stack of the oxide insulating layer 407 and the protective insulating layer 408 is a connection terminal electrode which functions as an input terminal. Further, in the terminal portion in FIG. 5B1, an electrode layer 416 formed using the same material as the gate wiring layer 211b is located below and overlaps with a second terminal 215g which is electrically connected to the source wiring, with the gate insulating layer 402 interposed therebetween. The electrode layer 416 is not electrically connected to the second terminal 215g, and a capacitor for preventing noise or static electricity can be formed if the potential of the electrode layer 416 is set to a potential different from that of the second terminal 215g, such as floating, GND, or 0 V. In addition, the second terminal 215g is electrically connected to the conductive layer 418 through a contact hole formed in the oxide insulating layer 407 and the protective insulating layer 408. The conductive layer 418 can be formed using the same light-transmitting material and through the same process as the first electrode 414.

A plurality of gate wirings, source wirings, common potential lines, and power supply lines is provided depending on the pixel density. Also in the terminal portion, a plurality of first terminals at the same potential as the gate wiring, second terminals at the same potential as the source wiring, third terminals at the same potential as the power supply line, fourth terminals at the same potential as the common potential line, and the like is arranged. The number of each of the terminals may be any number, and the number of the terminals may be determined by a practitioner as appropriate.

This embodiment can be freely combined with Embodiment 1, Embodiment 2, or Embodiment 3.

Embodiment 5

In this embodiment, examples of element structures of the light-emitting elements used for FIGS. 3A and 3C illustrated in Embodiment 2 will be described.

Figure 6A:
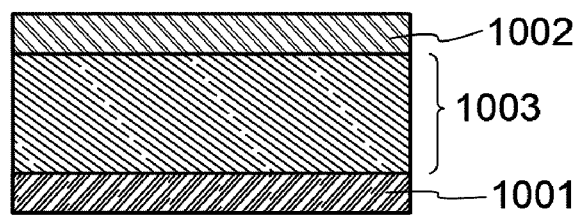
FIGS. 6A and 6B are cross-sectional views each illustrating an embodiment of the present invention.

In the element structure illustrated in FIG. 6A, an EL layer 1003 including a light-emitting region is sandwiched between a pair of electrodes (a first electrode 1001 and a second electrode 1002). Note that the first electrode 1001 is used as an anode and the second electrode 1002 is used as a cathode as an example in the following description of this embodiment.

The EL layer 1003 only need to include at least a light-emitting layer, and may also have a stacked structure including a functional layer in addition to the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), and the like. Specifically, functional layers such as a hole-injection layer, a hole-transport layer, an electron-transport layer, and an electron-injection layer can be used in combination as appropriate.

The light-emitting element illustrated in FIG. 6A emits light when current flows because of a potential difference generated between the first electrode 1001 and the second electrode 1002, and holes and electrons are recombined in the EL layer 1003. That is, the light-emitting element has a structure in which a light-emitting region is formed in the EL layer 1003.

Light emission is extracted to the outside through one or both of the first electrode 1001 and the second electrode 1002. Therefore, one or both of the first electrode 1001 and the second electrode 1002 are formed using a light-transmitting substance.

Figure 6B:
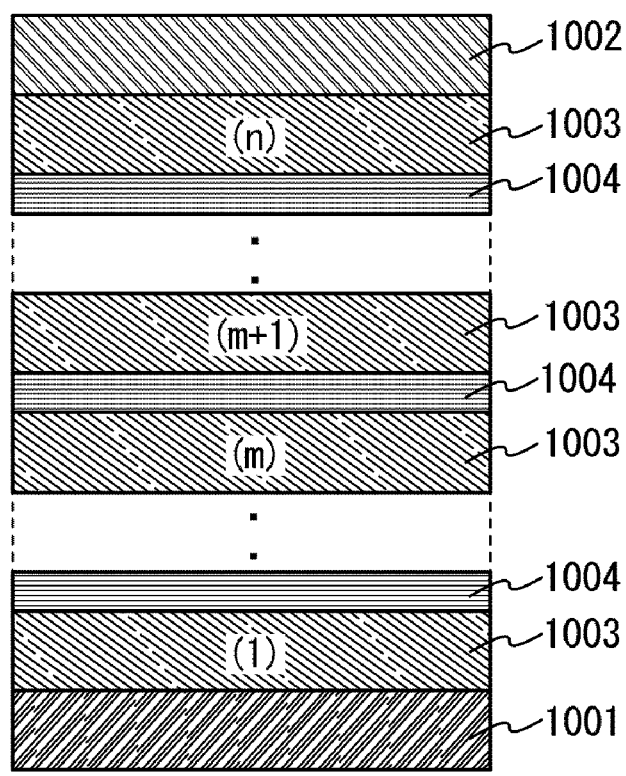

Note that a plurality of EL layers may be formed between the first electrode 1001 and the second electrode 1002 as illustrated in FIG. 6B. In the case of a stacked structure of n (n is a natural number of 2 or more) layers, a charge generation layer 1004 is preferably provided between an m-th (m is a natural number, $1 \leq m \leq n-1$) EL layer and an (m+1)-th EL layer.

The charge generation layer 1004 can be formed using a composite material of an organic compound and a metal oxide, a metal oxide, or a composite material of an organic compound and alkali metal, alkaline earth metal, or a compound thereof. Alternatively, these materials can be combined as appropriate. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a high molecular compound (such as oligomer, dendrimer, or polymer) can be used. Note that an organic compound having a hole mobility of higher than or equal to $10^{-6}$ cm$^2$/Vs is preferably used as a hole-transport organic compound. However, materials other than those can also be used as long as they have a hole-transport property higher than an electron-transport property. These materials used for the charge generation layer 1004 are excellent in carrier-injection property and carrier-transport property, and thus a light-emitting element can be driven with low current and with low voltage.

Note that the charge generation layer 1004 may be formed using a combination of a composite material of an organic compound and a metal oxide with another material. For example, a layer containing a composite material of an organic compound and a metal oxide may be combined with a layer containing a compound selected from substances with an electron-donation property and a compound with a high electron-transport property. Further, a layer containing a composite material of an organic compound and a metal oxide may be combined with a transparent conductive film.

As for a light-emitting element having such a structure, problems such as energy transfer and quenching are less likely to occur, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be easily obtained.

Note that the charge generation layer 1004 has a function of injecting holes to one EL layer 1003 which is formed in contact with the charge generation layer 1004 and a function of injecting electrons to the other EL layer 1003 which is formed in contact with the charge generation layer 1004, when voltage is applied to the first electrode 1001 and the second electrode 1002.

The light-emitting element illustrated in FIG. 6B can provide a variety of emission colors by changing the type of the light-emitting substance that is used for the light-emitting layer. In addition, a plurality of light-emitting substances of different emission colors is used as the light-emitting substance, whereby light emission having a broad spectrum or white light emission can be obtained.

In the case of obtaining white light emission using the light-emitting element illustrated in FIG. 6B, as for the combination of a plurality of light-emitting layers, a structure for emitting white light by including red light, green light, and blue light may be employed. For example, the structure may include a first EL layer containing a blue fluorescent material as a light-emitting substance and a second EL layer containing red and green phosphorescent materials as light-emitting substances. Alternatively, the structure may include a first EL layer exhibiting red light emission, a second EL layer exhibiting green light emission, and a third EL layer exhibiting blue light emission. Also with a structure including light-emitting layers emitting light of complementary colors, white light emission can be obtained. When light emission from the first EL layer and light emission from the second EL layer have complementary colors to each other in an element including two EL layers stacked, the combination of colors are as follows: blue and yellow, blue green and red, and the like.

Note that in the structure of the above-described stacked-layer element, by providing the charge generation layer between the stacked EL layers, the element can have long lifetime in a high-luminance region while keeping the current density low. In addition, a voltage drop due to resistance of the electrode material can be reduced, whereby uniform light emission in a large area is possible.

This embodiment can be combined with any one of Embodiments 1 to 4.

Embodiment 6

Figure 7A:
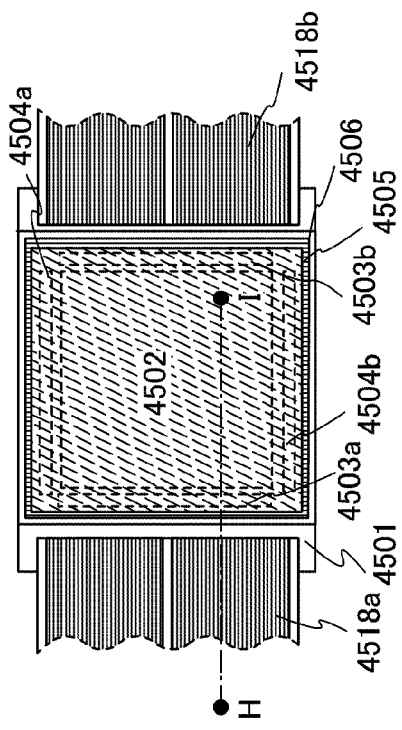
FIG. 7A is a plan view and FIG. 7B is a cross-sectional view illustrating an embodiment of the present invention.
Figure 7B:
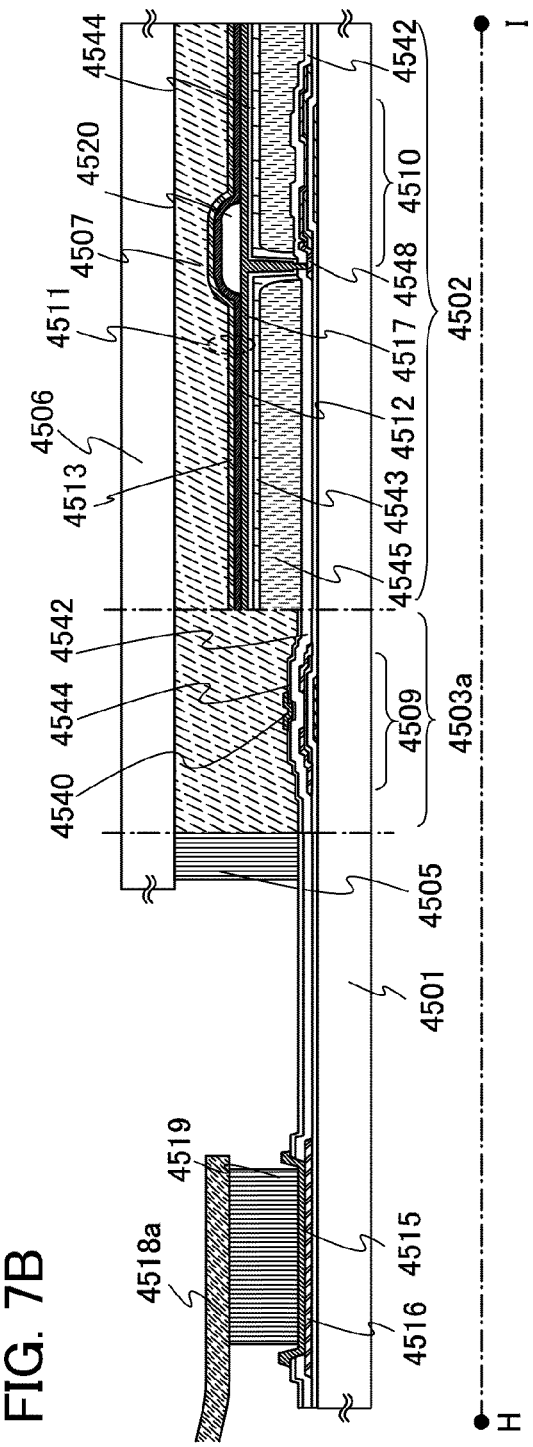

In this embodiment, the appearance and a cross section of a light-emitting display panel (also referred to as a light-emitting panel) will be described with reference to FIGS. 7A and 7B. FIG. 7A is a plan view of a panel in which a thin film transistor and a light-emitting element formed over a first substrate are sealed between the first substrate and a second substrate with a sealant. FIG. 7B is a cross-sectional view taken along line H-I of FIG. 7A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

Further, the pixel portion 4502, the signal line driver circuits 4503*a* and 4503*b*, and the scan line driver circuits 4504*a* and 4504*b* provided over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 7B.

As the thin film transistors 4509 and 4510, the highly reliable thin film transistor including an oxide semiconductor layer, which is described in Embodiment 1, can be employed. The thin film transistor 450 and the thin film transistor 460 described in Embodiment 1 can be used as the driver circuit thin film transistor 4509 and the pixel thin film transistor 4510, respectively. In this embodiment, the thin film transistors 4509 and 4510 are n-channel thin film transistors.

Over an insulating layer 4544, a conductive layer 4540 is provided so as to overlap with a channel formation region of an oxide semiconductor layer of the driver circuit thin film transistors 4509. By providing the conductive layer 4540 so as to overlap with the channel formation region of the oxide semiconductor layer, the amount of change in the threshold voltage of the thin film transistor 4509 before and after the BT test can be reduced. In addition, the conductive layer 4540 may have a potential that is the same as or different from that of a gate electrode layer of the thin film transistor 4509 and can function as a second gate electrode layer. Further, the conductive layer 4540 may have a potential of GND or 0 V, or be in a floating state.

The thin film transistor 4510 is electrically connected to a first pixel electrode 4517 through a connection electrode layer 4548. Further, an oxide insulating layer 4542 is formed to cover the oxide semiconductor layer of the thin film transistor 4510.

The oxide insulating layer 4542 may be formed using a material and a method similar to those of the oxide insulating layer 407 described in Embodiment 1. Further, the insulating layer 4544 is formed to cover the oxide insulating layer 4542. The insulating layer 4544 may be formed using a material and a method similar to those of the protective insulating layer 408 described in Embodiment 1.

A color filter layer 4545 is formed over the thin film transistor 4510 so as to overlap with a light-emitting region of a light-emitting element 4511.

Further, in order to reduce surface roughness of the color filter layer 4545, the color filter layer 4545 is covered with an overcoat layer 4543 functioning as a planarization insulating film.

Further, the insulating layer 4544 is formed over the overcoat layer 4543. The insulating layer 4544 may be formed using a material and a method similar to those of the protective insulating layer 408 described in Embodiment 1.

Reference numeral 4511 denotes a light-emitting element. The first pixel electrode 4517 which is a pixel electrode included in the light-emitting element 4511 is electrically connected to a source electrode layer or a drain electrode layer of the thin film transistor 4510. Note that the light-emitting element 4511 has a stacked structure of the first pixel electrode 4517, an electroluminescent layer 4512, and a second electrode 4513, but there is no particular limitation on the structure. The structure of the light-emitting element 4511 can be changed as appropriate, depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first pixel electrode 4517 so that a sidewall of the opening is formed as an inclined surface with continuous curvature.

The electroluminescent layer 4512 may be formed with a single layer or a plurality of layers stacked.

A protective film may be formed over the second electrode 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first pixel electrode 4517 included in the light-emitting element 4511, and a terminal electrode 4516 is formed using the same conductive film as the source electrode layer and the drain electrode layer of the thin film transistor 4509.

The connection terminal electrode 4515 is electrically connected to a terminal included in the FPC 4518a through an anisotropic conductive film 4519.

The substrate located in the direction in which light is extracted from the light-emitting element 4511 needs to have a light-transmitting property with respect to visible light. In that case, a light-transmitting material such as a glass plate, a plastic plate, a polyester film, or an acrylic film is used.

As the filler 4507, an ultraviolet curable resin or a thermosetting resin can be used, as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used as the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by roughness on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 7A and 7B.

Through the above process, a highly reliable light-emitting display device (display panel) as a semiconductor device can be manufactured.

Embodiment 7

In this embodiment, an example will be described below in which at least some of driver circuits and a thin film transistor provided in a pixel portion are formed over one substrate.

The thin film transistor provided in the pixel portion is formed in accordance with Embodiment 1. Since the thin film transistor described in Embodiment 1 is an n-channel TFT, some of driver circuits that can be constituted by n-channel TFTs among the driver circuits are formed over the substrate where the thin film transistor in the pixel portion is formed.

Figure 8A:
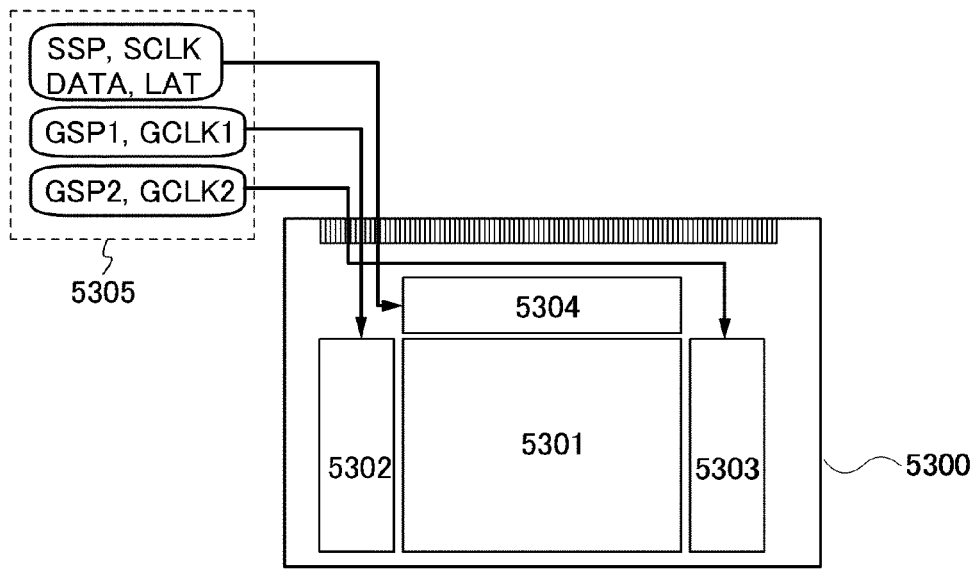
FIGS. 8A and 8B are block diagrams each illustrating a an active matrix display device.

FIG. 8A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that in cross regions of the scan lines and the signal lines, pixels each having a display element are arranged in matrix. The substrate 5300 of the display device is connected to a timing control circuit 5305 (also referred to as a controller or a control IC) through a connection portion such as a flexible printed circuit (FPC).

In FIG. 8A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that cost can be reduced. Moreover, the number of connections in the connection portion which are formed when wirings are extended from a driver circuit provided outside the substrate 5300 can be reduced, and the reliability or yield can be increased.

Note that the timing control circuit 5305 supplies, for example, a first scan line driver circuit start signal (GSP1) and a scan line driver circuit clock signal (GCLK1) to the first scan line driver circuit 5302. Further, the timing control circuit 5305 supplies, for example, a second scan line driver circuit start signal (GSP2) (which is also referred to as a start pulse) and a scan line driver circuit clock signal (GCLK2) to the second scan line driver circuit 5303. Moreover, the timing control circuit 5305 supplies a signal line driver circuit start signal (SSP), a signal line driver circuit clock signal (SCLK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 8B:
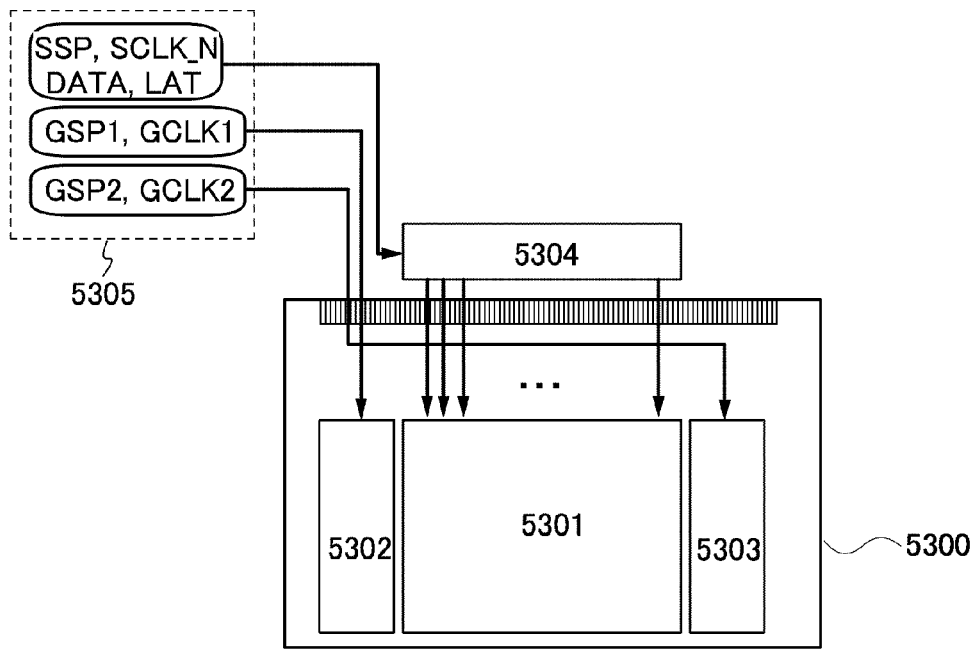

FIG. 8B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor. Thus, increase in size of the display device, reduction in cost, improvement in yield, or the like can be achieved.

Figure 9A:
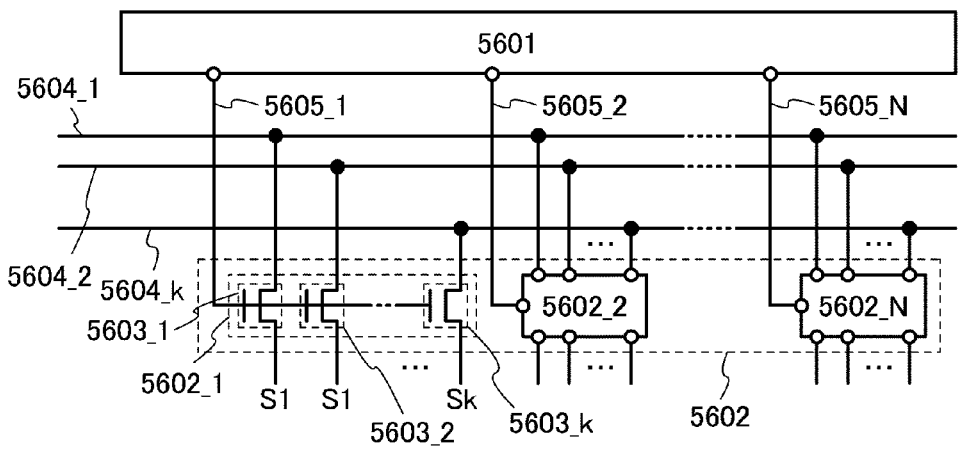
FIG. 9A illustrates a configuration of a signal line driver circuit and FIG. 9B is a timing chart illustrating operation thereof.
Figure 9B:
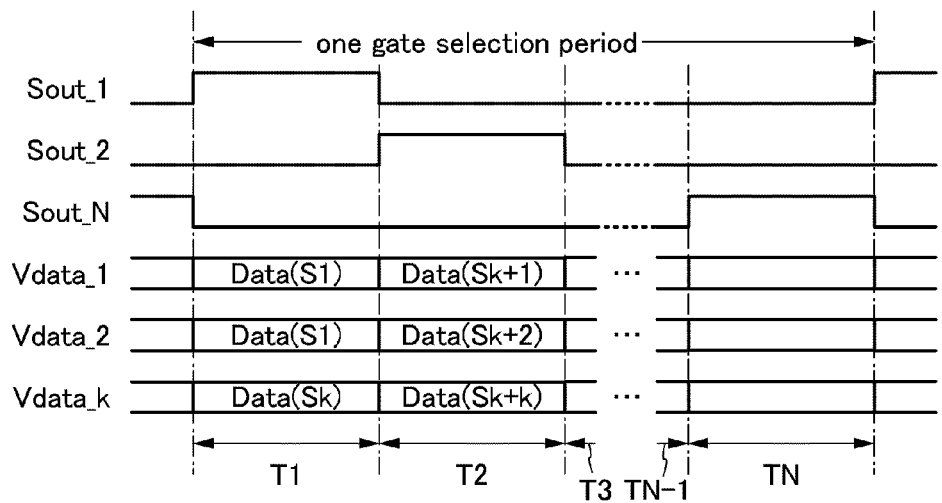

The thin film transistor described in Embodiment 1 is an n-channel TFT. FIGS. 9A and 9B illustrate an example of a configuration and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ (k is a natural number). The example where the thin film transistors 5603_1 to 5603_$k$ are n-channel TFTs is described below.

A connection relation in the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has a function of controlling conduction states between the wirings 5604_1 to 5604_$k$ and the signal lines S1 to Sk (conduction between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Moreover, the thin film transistors 5603_1 to 5603_$k$ have functions of controlling conduction states between the wirings 5604_1 to 5604_$k$ and the signal lines S1 to Sk, respectively, that is, functions of supplying potentials of the wirings 5604_1 to 5604_$k$ to the signal lines S1 to Sk, respectively. In this manner, each of the thin film transistors 5603_1 to 5603_$k$ functions as a switch.

The video signal data (DATA) is input to each of the wirings 5604_1 to 5604_$k$. The video signal data (DATA) is often an analog signal that corresponds to an image signal or image data.

Next, the operation of the signal line driver circuit in FIG. 9A is described with reference to a timing chart in FIG. 9B. FIG. 9B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_$k$. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_$k$ are turned on, so that the wirings 5604_1 to 5604_$k$ and the signal lines S1 to Sk are brought into conduction. At this time, Data(S1) to Data(Sk) are input to the wirings 5604_1 to 5604_$k$, respectively. The Data(S1) to Data(Sk) are written into pixels in a first to kth columns in the selected row through the thin film transistors 5603_1 to 5603_$k$, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when a video signal is written into pixels by a plurality of columns; thus, insufficient writing of a video signal can be prevented.

Note that any of the circuits constituted by the thin film transistors described in any of Embodiments 1, 3, and 6 can be used for the shift register 5601 and the switching circuit 5602. In that case, the shift register 5601 can be constituted by only n-channel transistors or only p-channel transistors.

One embodiment of a shift register which is used for part of the scan line driver circuit and/or the signal line driver circuit is described with reference to FIGS. 10A to 10D and FIGS. 11A and 11B.

The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply large current is used.

Figure 10A:
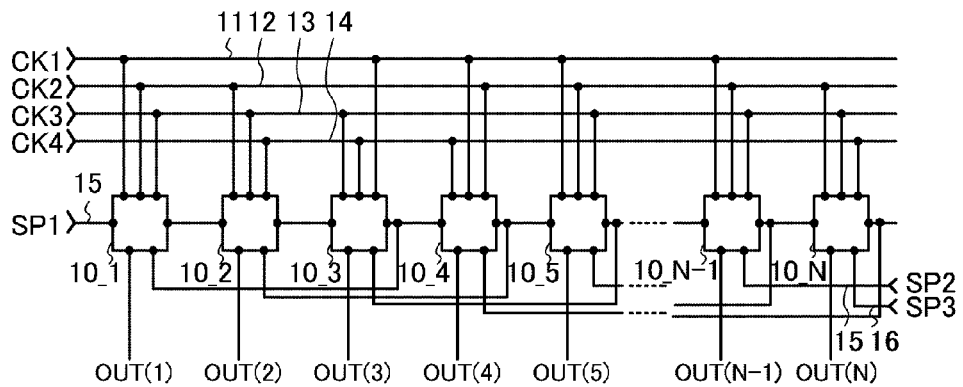
FIGS. 10A to 10D are circuit diagrams illustrating a configuration of a shift register.

The shift register includes a first to Nth pulse output circuits 10_1 to 10_N (N is a natural number greater than or equal to 3) (see FIG. 10A). In the shift register illustrated in FIG. 10A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage and second output signals (OUT(1) to OUT(N)) to be input to another circuit or the like. Note that since the subsequent-stage signal OUT(n+2) is not input to the last two stages of the shift register as illustrated in FIG. 10A, a second start pulse SP2 and a third start pulse SP3 may be input to the pulse output circuits of the last two stages, for example.

Note that a clock signal (CK) is a signal that alternates between an H level and an L level (also referred to as an L signal or a signal at low power supply potential level) at regular intervals. Here, the first to fourth clock signals (CK1) to (CK4) are sequentially delayed by ¼ cycle. In this embodiment, driving or the like of the pulse output circuit is controlled with the first to fourth clock signals (CK1) to (CK4). Note that the clock signal is also referred to as GCK or SCK in some cases, depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 10A, the first input terminal 21 is electrically connected to the first wiring 11, the second input terminal 22 is electrically connected to the second wiring 12, and the third input terminal 23 is electrically connected to the third wiring 13. In the second pulse output circuit 102, the first input terminal 21 is electrically connected to the second wiring 12, the second input terminal 22 is electrically connected to the third wiring 13, and the third input terminal 23 is electrically connected to the fourth wiring 14.

Figure 10B:
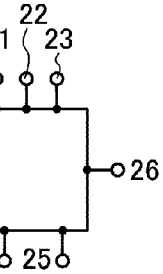

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 10B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1) (SR) is output from the first output terminal 26; and the second output signal OUT(1) is output from the second output terminal 27.

Figure 10C:
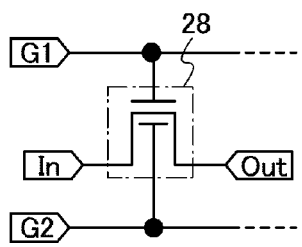

In the first to Nth pulse output circuits 10_1 to 10_N, the thin film transistor (TFT) having four terminals described in the above embodiment can be used in addition to a thin film transistor having three terminals. FIG. 10C illustrates the symbol of a thin film transistor 28 having four terminals, which is described in the above embodiment. The symbol of the thin film transistor 28 illustrated in FIG. 10C represents the thin film transistor having four terminals which is described in either of Embodiments 3 and 6 and is used in the drawings and the like. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode. The thin film transistor 28 is an element which can control electric current between an In terminal and an Out terminal with a first control signal G1 which is input to a lower gate electrode and a second control signal G2 which is input to an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the thin film transistor 28 illustrated in FIG. 10C can be controlled to be a desired level by providing gate electrodes above and below a channel formation region of the thin film transistor 28 with a gate insulating film interposed between the upper gate electrode and the channel formation region and between the lower gate electrode and the channel formation region, and by controlling a potential of the upper gate electrode and/or the lower gate electrode.

Next, an example of a specific circuit configuration of the pulse output circuit is described with reference to FIG. 10D.

Figure 10D:
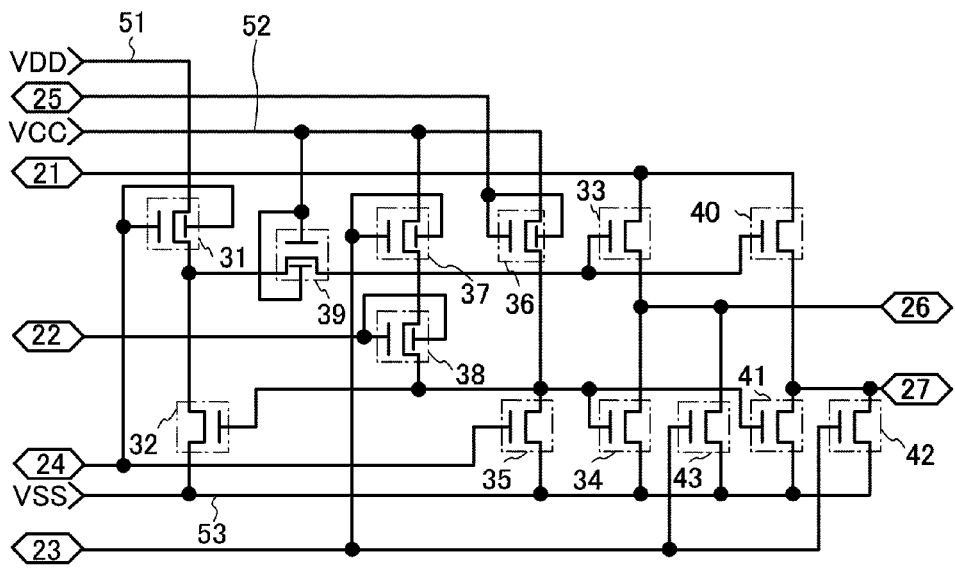

The first pulse output circuit 10_1 includes first to thirteenth transistors 31 to 43 (see FIG. 10D). A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 10D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. Note that as in FIG. 10D, the thin film transistor 28 having four terminals which is illustrated in FIG. 10C is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected in accordance with a control signal of the gate electrode, and can reduce a malfunction of the pulse output circuit by quick response (sharp rising of on-current) to the control signal input to the gate electrode. By using the thin film transistor 28 having four terminals which is illustrated in FIG. 10C, the threshold voltage can be controlled, and a malfunction of the pulse output circuit can be further reduced. Note that although the first control signal G1 and the second control signal G2 are the same control signals in FIG. 10D, the first control signal G1 and the second control signal G2 may be different control signals.

In FIG. 10D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 10D, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 11A).

Figure 11A:
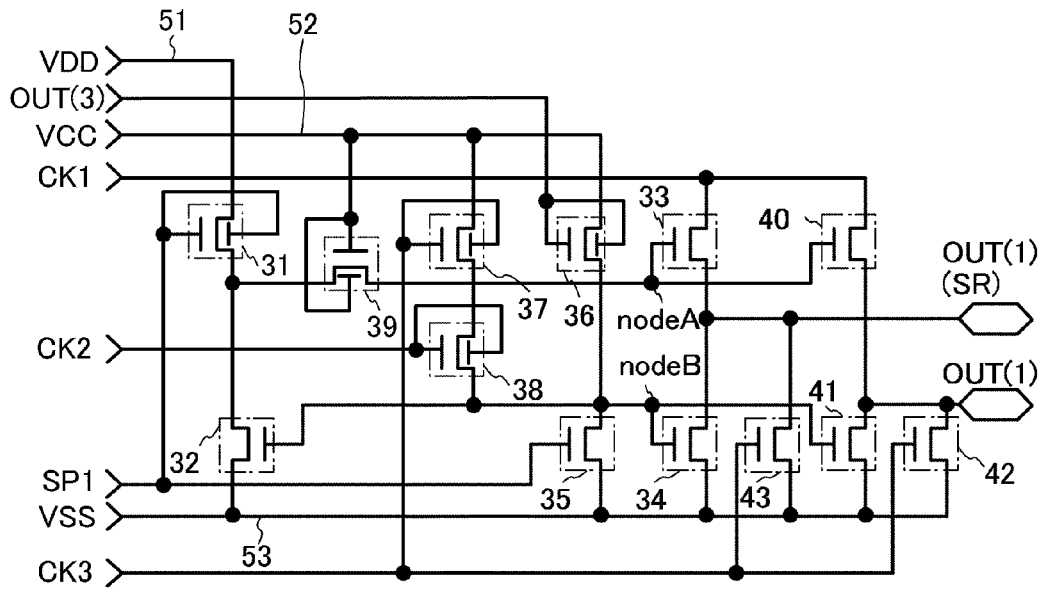
FIG. 11A illustrates a configuration of a shift register and FIG. 11B is a timing chart illustrating operation thereof.

FIG. 11A illustrates signals that are input to or output from the first to fifth input terminals 21 to 25 and the first and second output terminals 26 and 27 in the case where the pulse output circuit illustrated in FIG. 10D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 10D and FIG. 11A, a capacitor for performing bootstrap operation by bringing the node A into a floating state may be additionally provided. Furthermore, a capacitor having one electrode electrically connected to the node B may be additionally provided in order to hold a potential of the node B.

Figure 11B:
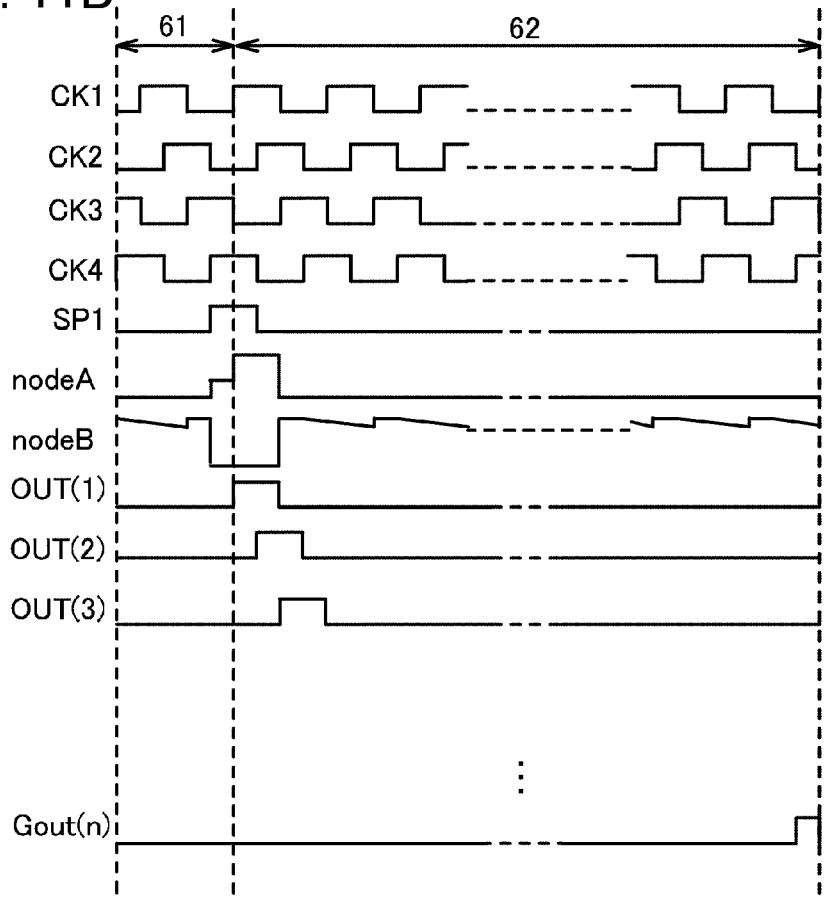

FIG. 11B is a timing chart of a shift register including a plurality of pulse output circuits illustrated in FIG. 11A. Note that when the shift register is included in a scan line driver circuit, a period 61 in FIG. 11B corresponds to a vertical retrace period and a period 62 corresponds to a gate selection period.

Note that by providing the ninth transistor 39 in which the second power supply potential VCC is applied to the gate as illustrated in FIG. 11A, the following advantages are obtained before and after bootstrap operation.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31. Consequently, in the first transistor 31, high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, provision of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the transistor including an oxide semiconductor less deteriorates by application of a high potential to a gate electrode as compared to a transistor including amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 may be supplied from the second input terminal 22 and the third input terminal 23, respectively. In the shift register illustrated in FIG. 11A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in the case where a state of the seventh transistor 37 and the eighth transistor 38 in the shift register illustrated in FIG. 11A is changed so that both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by fall in potentials of the second input terminal 22 and the third input terminal 23, is caused only once by fall in potential of the gate electrode of the eighth transistor 38. Therefore, the connection relation, in which the clock signal CK3 is supplied from the third input terminal 23 to the gate electrodes (the lower gate electrode and the upper gate electrode) of the seventh transistor 37 and the clock signal CK2 is supplied from the second input terminal 22 to the gate electrodes (the lower gate electrode and the upper gate electrode) of the eighth transistor 38, is preferable. That is because the number of times of the change in the potential of the node B can be reduced, whereby the noise can be decreased.

In this manner, an H-level signal is regularly supplied to the node B in a period during which the potentials of the first output terminal 26 and the second output terminal 27 are held at an L level; thus, a malfunction of the pulse output circuit can be suppressed.

Embodiment 8

A light-emitting device disclosed in this specification can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 12A:
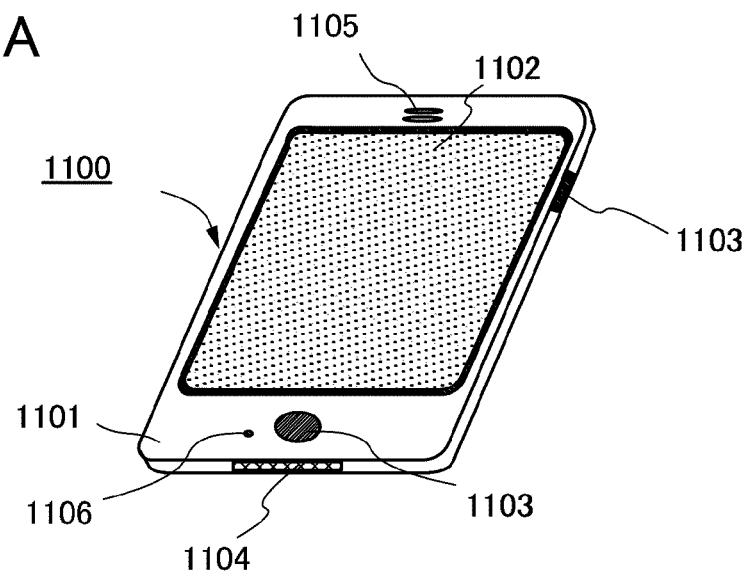
FIGS. 12A and 12B illustrate electronic appliances.

FIG. 12A illustrates an example of a cellular phone. A cellular phone 1100 includes a display portion 1102 incorporated in a housing 1101, an operation button 1103, an external connection port 1104, a speaker 1105, a microphone 1106, and the like In the cellular phone 1100 illustrated in FIG. 12A, data can be input when a person touches the display portion 1102 with his/her finger or the like. In addition, operation such as making calls and composing mails can be performed when a person touches the display portion 1102 with his/her finger or the like.

The display portion 1102 has mainly three screen modes. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1102 so that text displayed on a screen can be input. In this case, it is preferable to display a keyboard or number buttons on most part of the screen of the display portion 1102.

By providing a detection device including a sensor for detecting inclination, such as a gyroscope or an acceleration sensor, inside the cellular phone 1100, display on the screen of the display portion 1102 can be automatically changed by determining the orientation of the cellular phone 1100 (whether the cellular phone 1100 is placed horizontally or vertically).

Further, the screen modes are changed by touching the display portion 1102 or operating the operation button 1103 of the housing 1101. Alternatively, the screen modes can be changed depending on the kind of an image displayed on the display portion 1102. For example, when a signal of an image displayed on the display portion is a signal of moving image data, the screen mode is changed into the display mode. When the signal is a signal of text data, the screen mode is changed into the input mode.

Further, in the input mode, when input by touching the display portion 1102 is not performed for a certain period while a signal detected by an optical sensor in the display portion 1102 is detected, the screen mode may be controlled so as to be changed from the input mode into the display mode.

The display portion 1102 can also function as an image sensor. For example, an image of a palm print, a fingerprint, or the like is taken when the display portion 1102 is touched with the palm or the finger, so that authentication can be performed. Further, by using a backlight which emits near-infrared light or a sensing light source which emits near-infrared light in the display portion, the image of a finger vein, a palm vein, or the like can be taken.

A plurality of thin film transistors 460 which are described in Embodiment 1 is arranged in the display portion 1102. Since the thin film transistors 460 have a light-transmitting property, the thin film transistors 460 do not block incident light in the case of providing an optical sensor for the display portion 1102 and thus are effective. In addition, also in the case of providing a backlight which emits near-infrared light or a sensing light source which emits near-infrared light for the display portion, the thin film transistors 460 do not block light and thus are preferable.

Figure 12B:
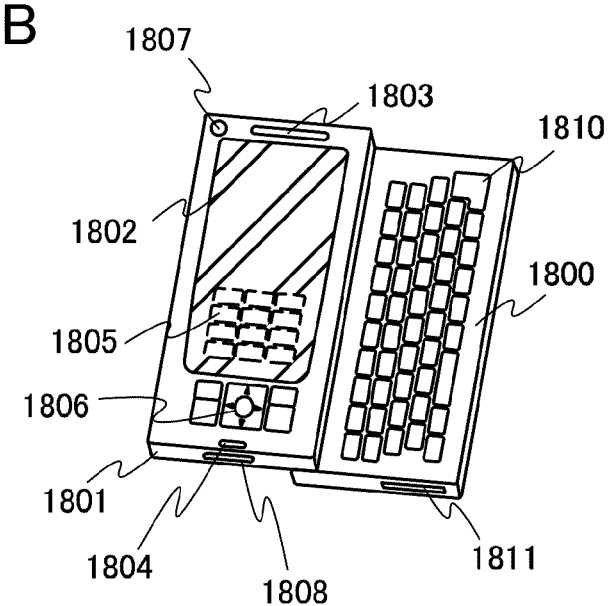

FIG. 12B illustrates another example of a cellular phone. A portable information terminal one example of which is illustrated in FIG. 12B can have a plurality of functions. For example, in addition to a telephone function, such a portable information terminal can have a function of processing a variety of data by incorporating a computer.

The portable information terminal illustrated in FIG. 12B includes a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1801.

Further, the display panel 1802 is provided with a touch panel. A plurality of operation keys 1805 which is displayed as images is illustrated by dashed lines in FIG. 12B.

Further, in addition to the above structure, a contactless IC chip, a small memory device, or the like may be incorporated.

The light-emitting device of the present invention can be used for the display panel 1802 and the direction of display is changed as appropriate depending on an application mode. Further, the camera lens 1807 is provided on the same surface as the display panel 1802, and thus the portable information terminal can be used as a video phone. The speaker 1803 and the microphone 1804 can be used for videophone calls, recording, and playing sound, and the like as well as voice calls. Moreover, the housings 1800 and 1801 in a state where they are developed as illustrated in FIG. 12B can be slid so that one overlaps with the other; therefore, the portable information terminal can be reduced in size so as to be suitable for being carried.

The external connection terminal 1808 can be connected to an AC adapter and various cables such as a USB cable, and charging and data communication with a personal computer are possible. Moreover, a storage medium can be inserted into the external memory slot 1811 so that a larger amount of data can be stored and can be moved.

In addition to the above functions, an infrared communication function, a television reception function, or the like may be provided.

Figure 13A:
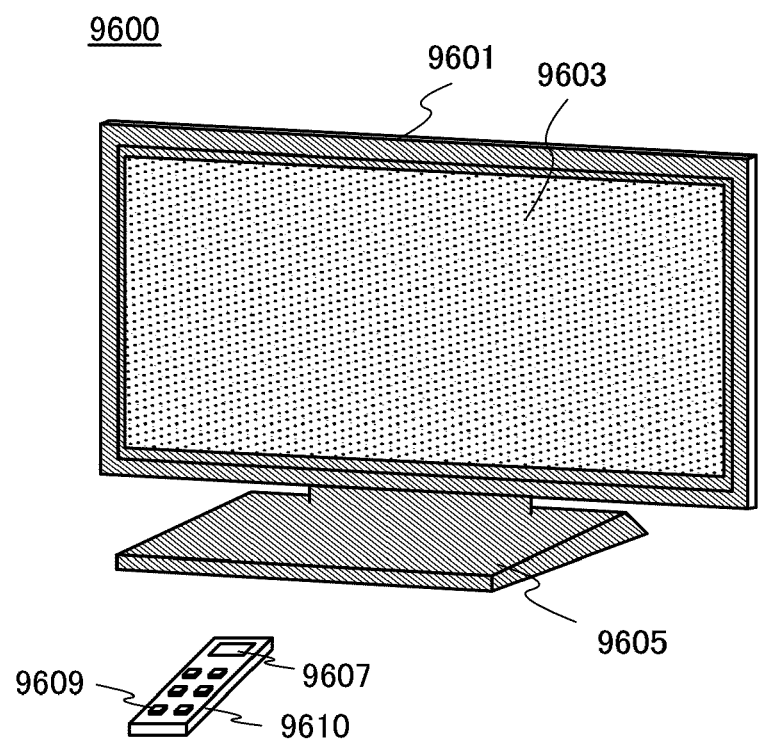
FIGS. 13A and 13B illustrate electronic appliances.

FIG. 13A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with operation keys 9609 of the remote controller 9610, and images displayed on the display portion 9603 can be controlled. Further, the remote controller 9610 may be provided with a display portion 9607 for displaying data output from the remote controller 9610.

Note that the television set 9600 includes a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver or between receivers) data communication can be performed.

A plurality of thin film transistors 460 described in Embodiment 1 is arranged in the display portion 9603; therefore, the aperture ratio can be increased especially when the light-emitting device is a bottom emission type.

Figure 13B:
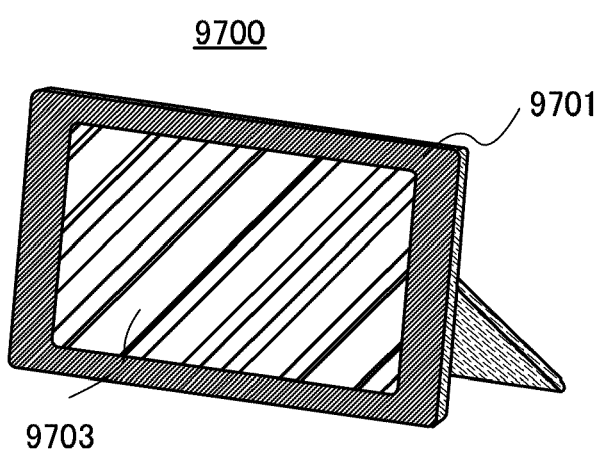

FIG. 13B illustrates an example of a digital photo frame. For example, in a digital photo frame 9700, a display portion 9703 is incorporated in a housing 9701. The display portion 9703 can display a variety of images. For example, image data photographed by a digital camera or the like are displayed, so that the digital photo frame can function as a normal photo frame.

A plurality of thin film transistor 460 described in Embodiment 1 is arranged in the display portion 9703; therefore, the aperture ratio can be increased especially when the light-emitting device is a bottom emission type.

Note that the digital photo frame 9700 includes an operation portion, an external connection terminal (such as a USB terminal or a terminal which can be connected to a variety of cables like a USB cable), a recording medium insertion portion, and the like. Although these components may be provided on a surface on which the display portion is provided, it is preferable to provide them on a side surface or a back surface because the design of the digital photo frame is improved. For example, a memory which stores data of an image photographed by a digital camera is inserted in the recording medium insertion portion of the digital photo frame, so that the image data can be transferred and displayed on the display portion 9703.

Further, the digital photo frame 9700 may transmit and receive data wirelessly. Through wireless communication, desired image data can be transferred and displayed.

Figure 14:
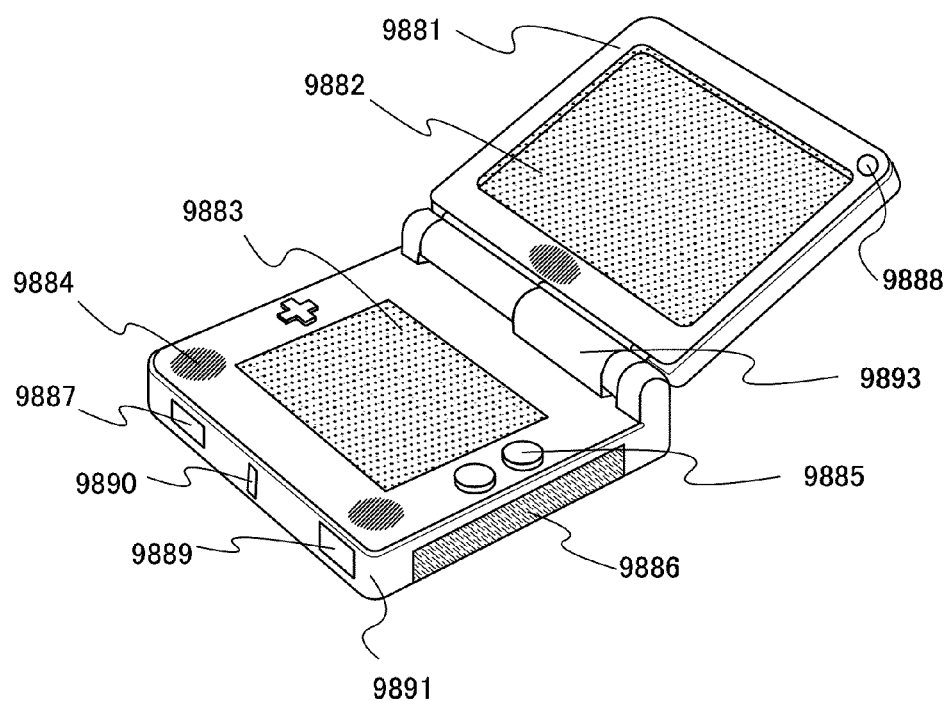
FIG. 14 illustrates an electronic appliance.

FIG. 14 is a portable game machine, which includes two housings 9881 and 9891 connected to each other with a joint portion 9893 so that the portable game machine can be opened or folded. A display portion 9882 and a display portion 9883 are incorporated in the housing 9881 and the housing 9891, respectively.

A plurality of thin film transistors 460 described in Embodiment 1 is arranged in the display portion 9882 and the display portion 9883; therefore, the aperture ratio can be increased especially when the light-emitting device is a bottom emission type.

In addition, the portable game machine illustrated in FIG. 14 further includes a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radiation, flow rate, humidity, gradient, vibration, odor, or infrared ray), and a microphone 9889), and the like. Needless to say, the structure of the portable game machine is not limited to the above and other structures provided with at least the thin film transistor disclosed in this specification may be employed. The portable game machine can include other accessories as appropriate. The portable game machine illustrated in FIG. 14 has a function of reading a program or data stored in a recording medium to display it on the display portion, and a function of sharing information with another portable game machine through wireless communication. Note that the function of the portable game machine illustrated in FIG. 14 is not limited to those described above, and the portable game machine can have a variety of functions.

Figure 15:
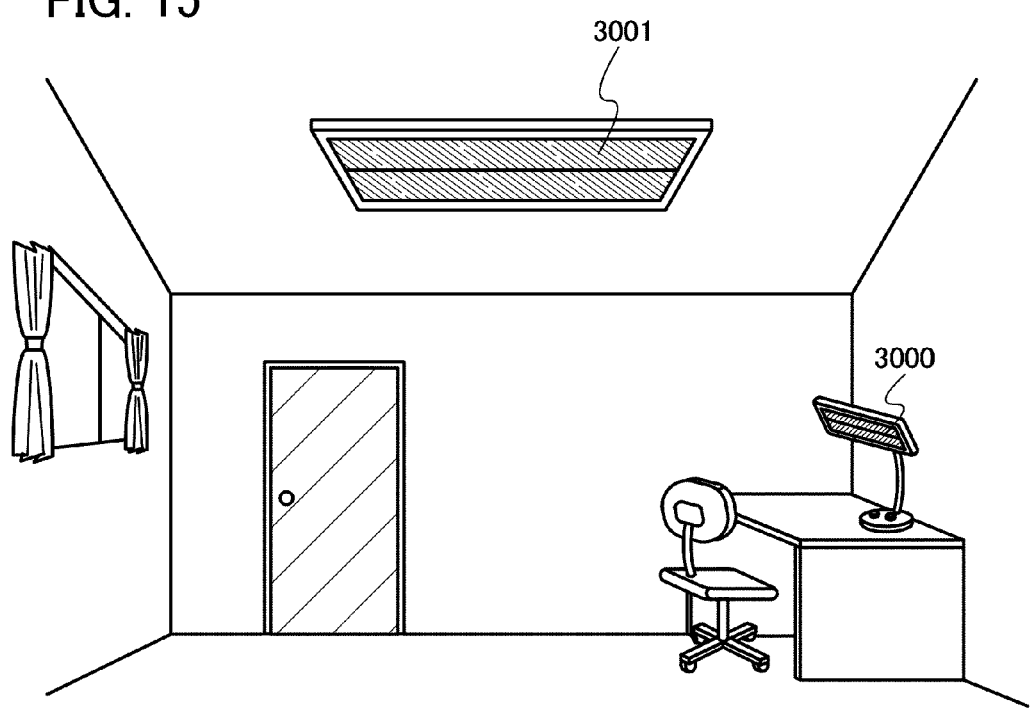
FIG. 15 illustrates electronic appliances.

FIG. 15 is an example in which the light-emitting device formed in accordance with the above embodiment is used as an indoor lighting device 3001. Since the light-emitting device described in Embodiment 2 can be enlarged and thus can be used as a lighting device having a large area. The above light-emitting device described in Embodiment 2 can also be used as a desk lamp 3000. Note that a lighting device includes a wall light, a light in a car, a guide light, and the like in its category in addition to the ceiling light and the desk lamp.

As described above, the light-emitting devices described in Embodiments 2 and 3 can be provided in display panels of a variety of electronic appliances like the above. The thin film transistor 450 is used for a driver circuit and the thin film transistor 460 is used as a switching element of a display panel, whereby a highly reliable electronic appliance which includes a display portion having a high aperture ratio especially when the light-emitting device is a bottom emission type can be provided.

This application is based on Japanese Patent Application serial no. 2009-204929 filed with Japan Patent Office on Sep. 4, 2009, the entire contents of which are hereby incorporated by reference.

The invention claimed is:

1. A light-emitting device comprising:
   a pixel portion including a first thin film transistor over a substrate; and
   a driver circuit including a second thin film transistor over the substrate, wherein the first thin film transistor has a different structure from the second thin film transistor,
   wherein the first thin film transistor comprises:
      a first gate electrode layer over the substrate;
      a gate insulating layer over the first gate electrode layer;
      a first source electrode layer and a first drain electrode layer over the gate insulating layer;
      a first oxide semiconductor layer over the gate insulating layer, the first source electrode layer, and the first drain electrode layer;
      a first oxide insulating layer in contact with the first oxide semiconductor layer; and
      a connection electrode layer over the gate insulating layer, wherein the connection electrode layer is electrically connected to one of the first source electrode layer and the first drain electrode layer,
   wherein the pixel portion comprises:
      a color filter layer over the first oxide insulating layer;
      a pixel electrode over the color filter layer, wherein the pixel electrode is electrically connected to the connection electrode layer;
      a light-emitting layer over the pixel electrode; and
      an electrode over the light-emitting layer,
   wherein the first gate electrode layer, the gate insulating layer, the first oxide semiconductor layer, the first source electrode layer, the first drain electrode layer, and the first oxide insulating layer have a light-transmitting property, and
   wherein the connection electrode layer is in contact with a top surface of the first oxide semiconductor layer, a side surface of the first oxide semiconductor layer, and a side surface of the one of the first source electrode layer and the first drain electrode layer.

2. The light-emitting device according to claim 1,
   wherein the second thin film transistor comprises a second gate electrode layer, a second source electrode layer, and a second drain electrode layer which are formed using a material different from a material of the first gate electrode layer, the first source electrode layer, and the first drain electrode layer, and
   wherein the second gate electrode layer, the second source electrode layer, and the second drain electrode layer are formed using a conductive material having lower resistance than a conductive material of the first source electrode layer, and the first drain electrode layer.

3. The light-emitting device according to claim 1,
   wherein the connection electrode layer is formed using a film comprising an element selected from the group consisting of Al, Cr, Cu, Ta, Ti, Mo, and W as a main component, an alloy film comprising any of the elements, or a stacked film including the films in combination.

4. The light-emitting device according to claim 2,
   wherein the second source electrode layer and the second drain electrode layer are formed using the same material as the connection electrode layer.

5. The light-emitting device according to claim 1,
   wherein the first source electrode layer and the first drain electrode layer are formed using indium oxide, indium oxide-tin oxide alloy, indium oxide-zinc oxide alloy, or zinc oxide.

6. The light-emitting device according to claim 1,
   wherein the second thin film transistor comprises:
      a second oxide semiconductor layer; and
      a second oxide insulating layer over the second oxide semiconductor layer, and
   wherein a channel formation region of the second oxide semiconductor layer is in contact with the second oxide insulating layer.

7. The light-emitting device according to claim 6,
   wherein the first oxide insulating layer and the second oxide insulating layer are formed using a silicon oxide film or an aluminum oxide film formed by a sputtering method.

8. The light-emitting device according to claim 1, wherein the first oxide semiconductor layer comprises In—Ga—Zn—O based oxide semiconductor.

9. The light-emitting device according to claim 1, wherein the first oxide semiconductor layer is an i-type oxide semiconductor layer.

10. The light-emitting device according to claim 1, wherein the first oxide semiconductor layer comprises indium, zinc, and oxygen.

11. A light-emitting device comprising:
a pixel portion including a first thin film transistor over a substrate; and
a driver circuit including a second thin film transistor over the substrate, wherein the first thin film transistor has a different structure from the second thin film transistor,
wherein the first thin film transistor comprises:
  a first gate electrode layer over the substrate;
  a gate insulating layer over the first gate electrode layer;
  a first source electrode layer and a first drain electrode layer over the gate insulating layer;
  a first oxide semiconductor layer over the gate insulating layer, the first source electrode layer, and the first drain electrode layer;
  a first oxide insulating layer in contact with the first oxide semiconductor layer; and
  a connection electrode layer over the gate insulating layer, wherein the connection electrode layer is electrically connected to one of the first source electrode layer and the first drain electrode layer,
wherein the pixel portion comprises:
  a color filter layer over the first oxide insulating layer;
  a pixel electrode over the color filter layer, wherein the pixel electrode is electrically connected to the connection electrode layer;
  a light-emitting layer over the pixel electrode; and
  an electrode over the light-emitting layer,
wherein the first gate electrode layer, the gate insulating layer, the first oxide semiconductor layer, the first source electrode layer, the first drain electrode layer, and the first oxide insulating layer have a light-transmitting property,
wherein the first oxide insulating layer is in contact with a side surface of the first oxide semiconductor layer and a side surface of the other one of the first source electrode layer and the first drain electrode layer, and
wherein the connection electrode layer is in contact with a top surface of the first oxide semiconductor layer, a side surface of the first oxide semiconductor layer, and a side surface of the one of the first source electrode layer and the first drain electrode layer.

12. The light-emitting device according to claim 11, wherein the second thin film transistor comprises a second gate electrode layer, a second source electrode layer, and a second drain electrode layer which are formed using a material different from a material of the first gate electrode layer, the first source electrode layer, and the first drain electrode layer, and
wherein the second gate electrode layer, the second source electrode layer, and the second drain electrode layer are formed using a conductive material having lower resistance than a conductive material of the first source electrode layer, and the first drain electrode layer.

13. The light-emitting device according to claim 11, wherein the connection electrode layer is formed using a film comprising an element selected from the group consisting of Al, Cr, Cu, Ta, Ti, Mo, and W as a main component, an alloy film comprising any of the elements, or a stacked film including the films in combination.

14. The light-emitting device according to claim 13, wherein the second source electrode layer and the second drain electrode layer are formed using the same material as the connection electrode layer.

15. The light-emitting device according to claim 11, wherein the first source electrode layer and the first drain electrode layer are formed using indium oxide, indium oxide-tin oxide alloy, indium oxide-zinc oxide alloy, or zinc oxide.

16. The light-emitting device according to claim 11, wherein the second thin film transistor comprises:
  a second oxide semiconductor layer, and
  a second oxide insulating layer over the second oxide semiconductor layer, and
wherein a channel formation region of the second oxide semiconductor layer is in contact with the second oxide insulating layer.

17. The light-emitting device according to claim 16, wherein the first oxide insulating layer and the second oxide insulating layer are formed using a silicon oxide film or an aluminum oxide film formed by a sputtering method.

18. The light-emitting device according to claim 11, wherein the first oxide semiconductor layer comprises In—Ga—Zn—O based oxide semiconductor.

19. The light-emitting device according to claim 11, wherein the first oxide semiconductor layer is an i-type oxide semiconductor layer.

20. The light-emitting device according to claim 11, wherein the first oxide semiconductor layer comprises indium, zinc, and oxygen.

* * * * *

UNITED STATES PATENT AND TRADEMARK OFFICE
CERTIFICATE OF CORRECTION

PATENT NO. : 8,378,344 B2
APPLICATION NO. : 12/869327
DATED : February 19, 2013
INVENTOR(S) : Masayuki Sakakura et al.

It is certified that error appears in the above-identified patent and that said Letters Patent is hereby corrected as shown below:

In the Specification

At column 4, line 29, "1 $nMO_3(ZnO)_m$" should be --$InMO_3(ZnO)_m$--;

In the Claims

At column 46, line 20, "claim 13" should be --claim 12--.

Signed and Sealed this
Twenty-fifth Day of June, 2013

Teresa Stanek Rea
*Acting Director of the United States Patent and Trademark Office*